(12) United States Patent
Okabe et al.

(10) Patent No.: US 12,486,560 B2
(45) Date of Patent: Dec. 2, 2025

(54) ALIGNMENT MECHANISM, ALIGNMENT METHOD, FILM FORMING DEVICE AND FILM FORMING METHOD

(71) Applicant: Canon Tokki Corporation, Mitsuke (JP)

(72) Inventors: Shunsuke Okabe, Tokyo (JP); Kentaro Suzuki, Tokyo (JP); Taiichirou Aoki, Tokyo (JP); Yoshihiro Nakasu, Tokyo (JP)

(73) Assignee: CANON TOKKI CORPORATION, Mitsuke (JP)

( * ) Notice: Subject to any disclaimer, the term of this patent is extended or adjusted under 35 U.S.C. 154(b) by 736 days.

(21) Appl. No.: 17/580,046

(22) Filed: Jan. 20, 2022

(65) Prior Publication Data
US 2022/0148931 A1 May 12, 2022

Related U.S. Application Data

(63) Continuation of application No. PCT/JP2020/028386, filed on Jul. 22, 2020.

(30) Foreign Application Priority Data

Jul. 23, 2019 (KR) ......................... 10-2019-0089113

(51) Int. Cl.
*H01L 21/66* (2006.01)
*C23C 14/04* (2006.01)
(Continued)

(52) U.S. Cl.
CPC ............. *C23C 14/042* (2013.01); *C23C 14/24* (2013.01); *H01L 22/20* (2013.01); *H10K 71/166* (2023.02); *H10K 71/00* (2023.02)

(58) Field of Classification Search
CPC .......... H01L 22/20; H01L 22/12; H01L 21/02; H01L 21/67; H01L 21/68; H01L 21/683;
(Continued)

(56) References Cited

U.S. PATENT DOCUMENTS

2004/0261977 A1 12/2004 Allen et al.
2020/0083452 A1 3/2020 Heymanns
2020/0251691 A1 8/2020 Heymanns

FOREIGN PATENT DOCUMENTS

CN 1603958 A 4/2005
CN 109385601 A 2/2019
(Continued)

OTHER PUBLICATIONS

International Search Report issued in Intl. Appln. No. PCT/JP2020/028386 mailed Sep. 29, 2020. English translation provided.
(Continued)

*Primary Examiner* — Dah-Wei D. Yuan
*Assistant Examiner* — Nga Leung V Law
(74) *Attorney, Agent, or Firm* — ROSSI, KIMMS & McDOWELL LLP

(57) ABSTRACT

The alignment mechanism of the present disclosure is configured to adjust positions of a substrate and a mask, the alignment mechanism being characterized by including a substrate suctioner configured to suction and hold the substrate; a mask supporter configured to support the mask; a temporary receiver configured to temporarily support at least one of the substrate to be suctioned by the substrate suctioner and the mask to be placed on the mask supporter, the temporary receiver being provided at the mask supporter; a horizontal coarse movement stage mechanism that carries the mask supporter and the temporary receiver and moves the mask supporter and the temporary receiver within the horizontal plane; and a vertical coarse movement stage
(Continued)

mechanism that raises and lowers the horizontal coarse movement stage mechanism.

14 Claims, 16 Drawing Sheets

(51) Int. Cl.
*C23C 14/24* (2006.01)
*H10K 71/00* (2023.01)
*H10K 71/16* (2023.01)

(58) Field of Classification Search
CPC ............... H01L 21/682; H01L 21/6838; H01L 21/67259; H01L 21/02263; C23C 14/042; C23C 14/24; C23C 14/50; C23C 14/04; H10K 71/166; H10K 71/00; H10K 71/191; H10K 71/16; H05B 33/10
See application file for complete search history.

(56) References Cited

FOREIGN PATENT DOCUMENTS

| | | | |
|---|---|---|---|
| JP | H10239855 A | 9/1998 | |
| JP | 2003186199 A | 7/2003 | |
| JP | 2011195907 A * | 10/2011 | ........... C23C 14/042 |
| JP | 2014168030 A | 9/2014 | |
| JP | 2019513290 A | 5/2019 | |
| TW | 201103995 A * | 2/2011 | ............. C23C 14/24 |
| TW | 201214599 A | 4/2012 | |
| TW | 201707128 A | 2/2017 | |
| TW | 201836042 A | 10/2018 | |
| WO | WO-2007023552 A1 * | 3/2007 | ........... C23C 14/042 |
| WO | 2016199759 A1 | 12/2016 | |

OTHER PUBLICATIONS

Written Opinion issued in Intl. Appln. No. PCT/JP2020/028386 mailed Sep. 29, 2020.

Office Action issued in Taiwanese Appln. No. 109124692 mailed Oct. 26, 2021.

Office Action issued in Chinese Appln. No. 202080052936.2, mailed on Jul. 31, 2025.

Liu et al. "The development of a new control system for mask management" The Key Laboratory of Complex Systems and Intelligent Science, Institute of Automation, Chinese Academy of Sciences. Jan. 2007: pp. 1-7. English abstract provided. Cited in NPL 1.

* cited by examiner

MASK MARK

FIELD OF VIEW OF CAMERA

SUBSTRATE MARK

ALIGNMENT MECHANISM, ALIGNMENT METHOD, FILM FORMING DEVICE AND FILM FORMING METHOD

CROSS-REFERENCE TO RELATED APPLICATION

This application is a continuation application of International Application PCT/JP2020/028386 filed on Jul. 22, 2020 and designated the U.S., and this application is based upon and claims the benefit of priority of the prior Korean Patent Application No. 10-2019-0089113, filed on Jul. 23, 2019, the entire contents of which are incorporated herein by reference.

BACKGROUND OF THE INVENTION

Field of the Invention

The present disclosure relates to an alignment mechanism, an alignment method, a film forming device, and a film forming method.

Description of the Related Art

The application fields of organic EL display devices (organic EL displays) have been expanding not only to displays for smartphones, televisions, and automobiles, but also to VR-HMDs (Virtual Reality Head Mount Displays) and the like. In particular, for displays used for VR-HMDs, it is required that a pixel pattern be formed with high accuracy in order to reduce user dizziness.

In the manufacture of an organic EL display device, when an organic light emitting element (organic EL element; OLED) constituting the organic EL display device is formed, a film forming material, discharged from a film forming source of a film forming device, is formed into a film on a substrate through a mask on which a pixel pattern has been formed, thereby forming an organic layer or a metal layer.

In such a film forming device, in order to improve the film formation accuracy, the relative positions of the substrate and the mask are measured before a film forming step, and when the relative positions are shifted, a step of moving the substrate and/or the mask relative to each other and adjusting (aligning) the positions is required.

Accordingly, the conventional film forming device includes an alignment stage mechanism linked to both a substrate support unit and a mask stand. The film forming device also includes an alignment camera that image-captures alignment marks formed on the substrate and the mask. Further, the film forming device is provided with a transport mechanism for carrying the substrate and the mask in and out. In the film forming device, the substrate or the mask is transferred by the transport mechanism. The alignment mechanism performs alignment, based on relative position information of the substrate and the mask obtained by the alignment camera. In addition, a high-resolution alignment camera is required for high-precision alignment. However, the high-resolution alignment camera has a relatively narrow field of view, and it has been difficult to transfer the alignment mark, formed on the substrate and the mask into the field of view of the alignment camera, due to the transfer accuracy of the transport mechanism. In addition, it is mechanically difficult to improve the transfer accuracy of the transport mechanism. For this reason, the film forming device is equipped with a rough alignment camera having a low resolution but a relatively wide field of view and a fine alignment camera having a relatively narrow field of view but a high resolution, and the alignment process is divided into rough alignment, which aims to move the alignment mark formed on the substrate and mask within the field of view of the fine alignment camera, and fine alignment in which the alignment mark of the substrate and mask is aligned with high accuracy in order to enhance the film formation accuracy. Further, the alignment mechanism also includes a plurality of actuators (for example, two X-direction motors and one Y-direction motor) for positioning the alignment mark image-captured by the camera.

SUMMARY OF THE INVENTION

In the conventional film forming device, the alignment operation of the substrate and mask in the rough alignment step is performed by an individual alignment mechanism for the substrate and the mask. Therefore, an extra space for arranging the rough alignment mechanism is required, which leads to an increase in the size and cost of the device.

An object of the present disclosure is to provide an alignment mechanism having a rough alignment function while capable of reducing a device size and cost.

The alignment mechanism of the present disclosure is configured to adjust positions of a substrate and a mask, the alignment mechanism being characterized by including a substrate suctioner configured to suction and hold the substrate; a mask supporter configured to support the mask; a temporary receiver provided at the mask supporter and configured to temporarily support at least one of the substrate to be suctioned by the substrate suctioner and the mask to be placed on the mask supporter; a horizontal coarse movement stage mechanism that carries the mask supporter and the temporary receiver and moves the mask supporter and the temporary receiver within a horizontal plane; and a vertical coarse movement stage mechanism that raises and lowers the horizontal coarse movement stage mechanism.

The alignment method of the present disclosure is for adjusting positions of a substrate and a mask by using an alignment mechanism including a substrate suctioner configured to suction and holding the substrate; a mask supporter configured to support the mask; a temporary receiver that is provided at the mask supporter and temporarily supporting the substrate and the mask; a horizontal coarse movement stage mechanism that carries the mask supporter and the temporary receiver and moves the mask supporter and the temporary receiver within a horizontal plane; and a vertical coarse movement stage mechanism that raises and lowers the horizontal coarse movement stage mechanism, the alignment method being characterized by including: a substrate temporary receiving step of supporting the carried-in substrate by the temporary receiver; a substrate position adjustment step of adjusting the position of the substrate supported by the temporary receiver with respect to the substrate suctioner by driving the horizontal coarse movement stage mechanism to move the mask supporter and the temporary receiver in a horizontal plane; and a substrate suction step of suctioning the substrate, which has been positionally adjusted in the substrate position adjustment step, with the substrate suctioner.

The alignment method according to another embodiment of the present disclosure is for adjusting positions of a substrate and a mask by using an alignment mechanism including a substrate suctioner configured to suction and hold the substrate; a mask supporter configured to support the mask; a temporary receiver that is provided at the mask supporter and configured to temporarily support the substrate and the mask; a horizontal coarse movement stage mechanism that carries the mask supporter and the temporary receiver and moves the mask supporter and the temporary receiver within the horizontal plane; and a vertical coarse movement stage mechanism that raises and lowers the horizontal coarse movement stage mechanism, the alignment method being characterized by including: a mask temporary receiving step of supporting the carried-in mask by the temporary receiver; a mask position adjustment step of adjusting the position of the mask supported by the temporary receiver by driving the horizontal coarse movement stage mechanism to move the mask supporter and the temporary receiver in a horizontal plane; and a mask placement step of placing the mask, which has been positionally adjusted in the mask position adjustment step, on the mask supporter.

According to the present disclosure, it is possible to perform a rough alignment operation without having to provide a rough alignment mechanism on each of the substrate and the mask, and the size and cost of the device can be reduced.

DESCRIPTION OF THE EMBODIMENTS

Hereinafter, preferred embodiments and examples of the present disclosure will be described with reference to the drawings. However, the following embodiments and examples illustrate preferred configurations of the present disclosure, and the scope of the present disclosure is not limited to these configurations. Further, in the following description, the hardware configuration and software configuration of the apparatus, processing flow, manufacturing conditions, dimensions, materials, shapes, and the like are not intended to limit the scope of the present disclosure unless otherwise specified.

The present disclosure can be applied to a device for depositing various materials on the surface of a substrate to form a film, and can be suitably applied to a device for forming a thin film (material layer) having a desired pattern by vacuum vapor deposition.

As the material of the substrate, any material such as semiconductor (for example, silicon), glass, a film of a polymer material, and a metal can be selected, and the substrate may be, for example, a silicon wafer or a substrate in which a film such as a polyimide is laminated on a glass substrate. Further, as the film forming material, any material such as an organic material and a metallic material (metal, metal oxide, and the like) can be selected.

The present disclosure can be applied not only to a vacuum deposition apparatus based on heating and evaporation, but also to a film forming device including a sputtering device and a CVD (Chemical Vapor Deposition) device. Specifically, the technique of the present disclosure can be applied to an apparatus for manufacturing various electronic devices such as semiconductor devices, magnetic devices, and electronic components, and optical components. Specific examples of the electronic device include a light emitting element, a photoelectric conversion element, a touch panel, and the like.

The present disclosure is particularly preferably applicable to an apparatus for manufacturing an organic light emitting element such as an OLED and an organic photoelectric conversion element such as an organic thin-film solar cell. The electronic device in the present disclosure is also inclusive of a display device (for example, an organic EL display device) and a lighting device (for example, an organic EL lighting device) equipped with a light emitting element, and a sensor (for example, an organic CMOS image sensor) equipped with a photoelectric conversion element.

Electronic Device Manufacturing Apparatus

Figure 1:
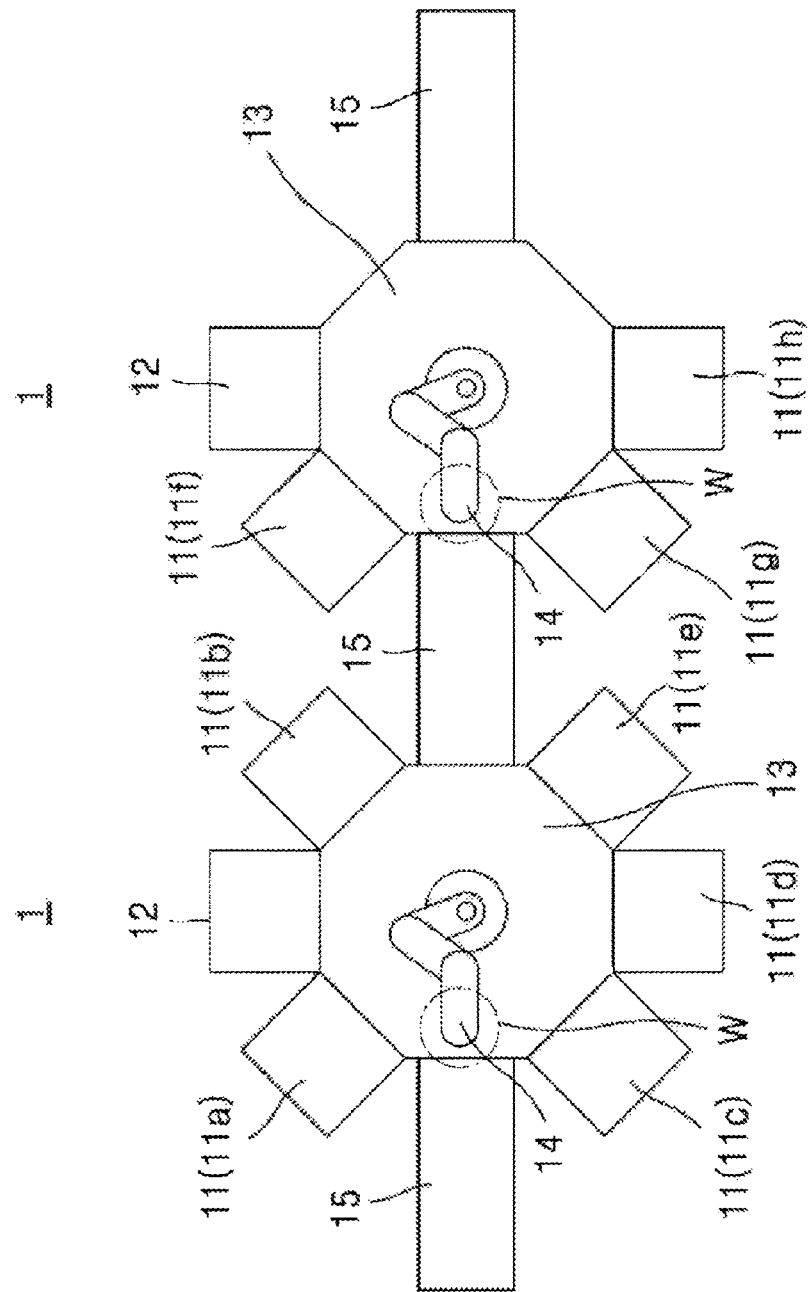
FIG. 1 is a schematic drawing of a part of an electronic device manufacturing apparatus.

FIG. 1 is a plan view schematically showing a configuration of a part of an electronic device manufacturing apparatus.

The manufacturing apparatus of FIG. 1 is used, for example, for manufacturing a display panel of an organic EL display device for a VR-HMD. In the case of a display panel for a VR-HMD, for example, after forming a film for forming an organic EL element on a silicon wafer of a predetermined size (for example, 300 mm), the silicon wafer is cut out along a region (scribing region) between the element forming regions to produce a plurality of small-size panels.

The electronic device manufacturing apparatus according to the present embodiment generally includes a plurality of cluster devices 1 and a relay device that connects the cluster devices.

The cluster device 1 includes film forming devices 11 that perform processing (for example, film formation) on a substrate W, a mask stock device 12 that stores masks before and after use, and a transport chamber 13 arranged in the center thereof. As shown in FIG. 1, the transport chamber 13 is connected to each of the film forming devices 11 and the mask stock device 12.

In the transport chamber 13, a transport robot 14 that transports the substrate W and the mask is arranged. The transport robot 14 has, for example, a structure in which a robot hand that holds a substrate W or a mask is attached to an articulated arm.

In the film forming device 11, a film of the film forming material discharged from the film forming source is formed on the substrate W through the mask. A series of film forming processes such as transfer of the substrate W/mask to and from the transport robot 14, adjustment (alignment) of the relative position between the substrate W and the mask, fixing of the substrate W on the mask, and film formation are performed by the film forming device 11.

In the manufacturing apparatus for manufacturing an organic EL display device, the film forming device 11 can be divided into an organic film forming device and a metal film forming device according to the type of the material to be formed into a film. The organic film forming device forms a film of an organic film forming material on the substrate W by vapor deposition or sputtering, and the metal film forming device forms a film of a metal film forming material on the substrate W by vapor deposition or sputtering.

In the manufacturing apparatus for manufacturing an organic EL display device, which film forming device is arranged at which position depends on the laminated structure of the organic EL elements to be manufactured, and a plurality of film forming devices for forming a film is arranged according to the laminated structure of the organic EL element.

An organic EL device usually has a structure in which a hole injection layer, a hole transport layer, a light emitting layer, an electron transport layer, an electron injection layer, and a cathode are laminated in this order on a substrate W on which an anode has been formed, and appropriate film forming devices are arranged along the flow direction of the substrate so that these layers can be sequentially deposited.

For example, in FIG. 1, film forming devices are arranged so that a film forming device 11a forms a hole injection layer HIL and/or a hole transport layer HTL, film forming devices 11b and 11f form a blue light emitting layer, a film forming device 11c forms a red light emitting layer, film forming devices 11d and 11e form a green light emitting layer, a film forming device 11g forms an electron transport layer ETL and/or an electron injection layer EIL, and a film forming device 11h forms a cathode metal film. In the example shown in FIG. 1, the film forming speed of the blue light emitting layer and the green light emitting layer is lower than the film forming speed of the red light emitting layer due to the characteristics of the material. Therefore, in order to balance the processing speeds, the blue light emitting layer and the green light emitting layer are each formed by two film forming devices, the present disclosure is not limited to this arrangement structure and other arrangement structures may be used.

In the mask stock device 12, a new mask to be used in the film forming step in the film forming device 11 and a used mask are separately stored in a plurality of cassettes. The transport robot 14 transports the used mask from the film forming device 11 to the cassette of the mask stock device 12, and transports a new mask stored in another cassette of the mask stock device 12 to the film forming device 11.

The relay device linking the plurality of cluster devices 1 includes a pass chamber 15 for transporting the substrate W between the cluster devices 1.

The transport robot 14 in the transport chamber 13 receives the substrate W from the pass chamber 15 on the upstream side and transports the substrate to one of the film forming devices 11 (for example, the film forming device 11a) in the cluster device 1. Further, the transport robot 14 receives the substrate W for which the film forming treatment in the cluster device 1 has been completed from one of the plurality of film forming devices 11 (for example, the film forming device 11e), and transports the substrate to the pass chamber 15 linked to the downstream side.

In addition to the pass chamber 15, the relay device can further include a buffer chamber (not shown) for absorbing the difference in processing speed of the substrate W in the cluster devices 1 on the upstream and downstream sides, and a swivel chamber (not shown) for changing the direction of the substrate W. For example, the buffer chamber includes a substrate loading unit that temporarily accommodates a plurality of substrates W, and the swivel chamber includes a substrate rotation mechanism (for example, a rotation stage or a transport robot) for rotating the substrate W by 180 degrees. As a result, the orientation of the substrate W is the same in the cluster device on the upstream side and the cluster device on the downstream side, and the substrate processing is facilitated.

The pass chamber 15 according to one embodiment of the present disclosure may include a substrate loading portion (not shown) for temporarily accommodating a plurality of substrates W or a substrate rotation mechanism. That is, the pass chamber 15 may also serve as a buffer chamber or a swivel chamber.

The film forming device 11, the mask stock device 12, the transport chamber 13, and the like constituting the cluster device 1 are maintained in a high-vacuum state in the process of manufacturing an organic light emitting element. The pass chamber 15 of the relay device is usually maintained in a low-vacuum state but may be maintained in a high-vacuum state if necessary.

The substrate W on which the film formation of a plurality of layers constituting the organic EL element is completed is transported to a sealing device (not shown) for sealing the organic EL element, a cutting device for cutting the substrate to a predetermined panel size (not shown), or the like.

In the present example, the configuration of the electronic device manufacturing apparatus has been described with reference to FIG. 1, but the present disclosure is not limited to this configuration, and other types of devices and chambers may be provided, and the arrangement of these devices and chambers may be changed.

For example, the electronic device manufacturing apparatus according to one embodiment of the present disclosure may be an in-line type instead of the cluster type shown in FIG. 1. That is, the apparatus may have a configuration such that the substrate W and the mask are loaded on a carrier, and the film is formed while transporting the substrate and the mask in a plurality of film forming devices arranged in a row. Further, the apparatus may have a structure in which a cluster type and an inline type are combined. For example, the film formation of organic layer(s) may be performed by a cluster type manufacturing apparatus, and steps from the film forming step of an electrode layer (cathode layer) to the sealing step, cutting step, and the like may be performed by an in-line type manufacturing apparatus.

Hereinafter, the specific configuration of the film forming device 11 will be described.

Film Forming Device

Figure 2:
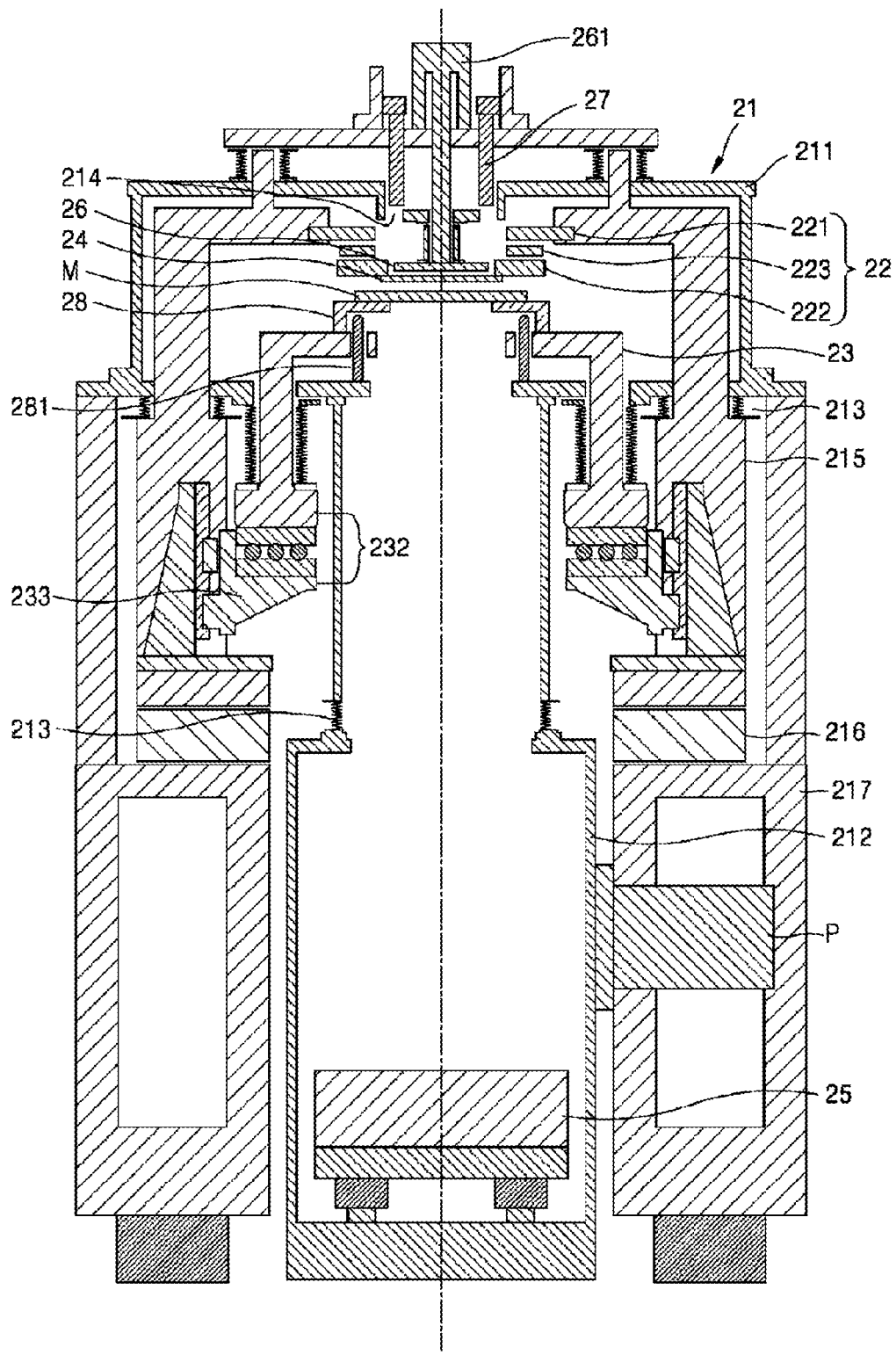
FIG. 2 is a schematic drawing of a film forming device having an alignment mechanism according to one embodiment of the present disclosure.

FIG. 2 is a schematic drawing showing the configuration of the film forming device 11 according to one embodiment of the present disclosure. In the following description, an XYZ Cartesian coordinate system with the vertical direction as the Z direction and the horizontal plane as the XY plane is used. Further, the rotation angle around the X axis is represented by $\theta_X$, the rotation angle around the Y axis is represented by $\theta_Y$, and the rotation angle around the Z axis is represented by $\theta_Z$.

FIG. 2 shows an example of the film forming device 11 that evaporates or sublimates a film forming material by heating and forms a film on the substrate W through the mask M.

The film forming device 11 includes a vacuum container 21 maintained in a vacuum atmosphere or an atmosphere of an inactive gas such as nitrogen gas, a fine movement stage mechanism 22 that is provided in the vacuum container 21 and serves for adjusting the position of the substrate W at least in the X direction, the Y direction, and the $\theta_Z$ direction, a mask stand 23 provided in the vacuum container 21 to support the mask M, a substrate suctioner 24 provided in the vacuum container 21 for suctioning and holding the substrate W, a receiving claw 28 provided in the vacuum container 21 for temporarily receiving the substrate W and the mask M, a mask receiving pin 281 that receives the mask when the mask is transferred from the receiving claw 28 to the mask stand 23, a coarse movement stage 232 that is equipped with the mask stand 23 and the receiving claw 28 and serves for adjusting the positions of the substrate W and the mask M in the X direction, the Y direction, and the θZ direction, and a film forming source 25 that is provided in the vacuum container 21, accommodates the film forming material, and atomizes and releases the film forming material at the time of film formation.

The film forming device 11 according to one embodiment of the present disclosure can further include a magnetic force applying means 26 for bringing the mask M into close contact with the substrate W side by magnetic force.

The vacuum container 21 of the film forming device 11 according to one embodiment of the present disclosure includes a first vacuum container section 211 in which the fine movement stage mechanism 22 is arranged and a second vacuum container section 212 in which the film forming source 25 is arranged. For example, the internal space of the entire vacuum container 21 is maintained in a high-vacuum state by a vacuum pump P connected to the second vacuum container section 212.

Further, a stretchable member 213 is installed at least between the first vacuum container section 211 and the second vacuum container section 212. The stretchable member 213 reduces the transmission of vibration from the vacuum pump linked to the second vacuum container section 212 and vibration from the foundation or floor on which the film forming device 11 is provided to the first vacuum container section 211 through the second vacuum container section 212. The stretchable member 213 may be, for example, a bellows, but the present disclosure is not limited thereto, and other members may be used as long as transmission of vibrations between the first vacuum container section 211 and the second vacuum container section 212 can be reduced.

The vacuum container 21 includes a reference frame 215 to which the fine movement stage mechanism 22 is fixedly linked. In one example of the present disclosure, as shown in FIG. 2, a stretchable member 213 may be further installed between the reference frame 215 and the first vacuum container section 211. As a result, it is possible to further reduce the transmission of external vibrations to the fine movement stage mechanism 22 via the reference frame 215.

A vibration isolation unit 216 is installed between the reference frame 215 and an installation stand 217 of the film forming device 11 to reduce the transmission of vibrations from the pedestal or the floor to the reference frame 215 through the installation stand 217 of the film forming device 11.

The fine movement stage mechanism 22 is for adjusting the position of the substrate W or the substrate suctioner 24 by a magnetic levitation linear motor, and adjusts the position of the substrate W or the substrate suctioner 24 in at least the X direction, Y direction, and $\theta_Z$ direction, and preferably in the six directions of the X direction, Y direction, Z direction, $\theta_X$ direction, $\theta_Y$ direction, and $\theta_Z$ direction.

The fine movement stage mechanism 22 includes a stage reference plate section 221 (first plate section) that functions as a fixed base, a fine movement stage plate section 222 (second plate section) that functions as a movable base, and a magnetic levitation unit 223 for causing the fine movement stage plate section 222 to magnetically levitate and move with respect to the stage reference plate section 221.

The mask stand 23 is for installing the mask M at the time of alignment and film formation.

The mask stand 23 is installed on a coarse movement stage 232 that can move in the horizontal direction (XYθ direction). As a result, the alignment marks formed on the substrate W and the mask M can be moved so as to be within the field of view of the alignment camera. Further, the mask stand 23 and the coarse movement stage 232 are installed on a coarse movement Z stage mechanism 233. As a result, the vertical spacing between the substrate W and the mask M can be easily adjusted. The coarse movement stage 232 and the coarse movement Z stage mechanism 233 are mechanically driven by a servomotor and a ball screw (not shown).

The mask stand 23 further includes the receiving claw 28 for temporarily receiving the substrate W and the mask M carried into the vacuum container 21 by the transport robot 14.

The receiving claw 28 is installed on the mask stand 23 and can temporarily receive the substrate W or the mask M from the transport robot 14. The receiving claw 28 can support the substrate W or the mask M during the rough alignment operation of moving the substrate W or the mask M to the center of the field of view of the fine alignment camera by the coarse movement stage 232. The receiving claw 28 has a drive shaft and can be at two positions, a receiving position of the substrate W or the mask M and a retracted position that does not interfere with the substrate W or the mask M. The receiving claw 28 can install the temporarily received substrate W on the substrate suctioner 24 to which the substrate W is to be suctioned during the film forming process by the drive shaft and the coarse movement Z stage mechanism 233. The temporarily received mask M can be likewise installed on the mask stand 23 on which the mask M is to be placed during the film forming process.

The mask receiving pin 281 is configured to be able to move up and down relative to the mask support surface of the mask stand 23. For example, as shown in FIG. 2, the mask receiving pin 281 can be configured to be movable up and down relative to the mask support surface of the mask stand 23 by the coarse movement Z stage mechanism 233. However, the present disclosure is not limited to such a configuration, and other configurations nay be used as long as the mask receiving pin 281 and the mask support surface of the mask stand 23 can be raised and lowered relative to each other. For example, the mask receiving pin 281 may be configured to have an independent raising/lowering mechanism that can raise and lower the mask receiving pin.

After the rough alignment operation is completed, the mask receiving pin 281 shown in FIG. 2 is raised relative to the mask support surface of the mask stand 23 by the descending operation of the coarse movement Z stage mechanism 233, and the mask M is transferred to the mask receiving pin 281. The receiving claw 28 moves to the retracted position, and the mask M is transferred from the mask receiving pin 281 to the mask stand 23 by the ascending operation of the coarse movement Z stage mechanism 233. Conversely, when the used mask M is carried out, the mask M placed on the mask stand 23 is received by the mask receiving pin 281 that has been raised relative to the mask installation surface of the mask stand 23 by the descending coarse movement Z stage mechanism 233. In that state, the receiving claw 28 is moved to the mask receiving position, and the coarse movement Z stage mechanism 233 is raised so that the mask M can be lifted by the receiving claw 28 and the hand of the transport robot 14 can receive the mask M.

The mask M has an opening pattern corresponding to the thin film pattern to be formed on the substrate W and is supported by the mask stand 23. For example, the mask M used for manufacturing an organic EL display panel for a VR-HMD includes a fine metal mask, which is a metal mask in which a fine opening pattern corresponding to an RGB pixel pattern of the light emitting layer of the organic EL element is formed, and an open mask used to form common layers (hole injection layer, hole transport layer, electron transport layer, electron injection layer, and the like) of an organic EL element.

The opening pattern of the mask M is defined by a blocking pattern that does not allow particles of the film forming material to pass through.

The substrate suctioner 24 is for suctioning and holding the substrate W as an object on which a film is to be deposited which has been transported by the transport robot 14 installed in the transport chamber 13. The substrate suctioner 24 is installed on the fine movement stage plate section 222 which is a movable stand of the fine movement stage mechanism 22.

The substrate suctioner 24 is, for example, an electrostatic chuck having a structure in which an electric circuit such as metal electrodes is embedded in a dielectric/insulator (for example, a ceramic material) matrix.

An electrostatic chuck as the substrate suctioner 24 may be of a Coulomb force type in which a dielectric having a relatively high resistance is interposed between an electrode and a suction surface, and the attachment is performed by a Coulomb force acting between the electrode and the object to be suctioned, of a Johnsen-Rahbek force type in which a dielectric having a relatively low resistance is interposed between an electrode and a suction surface, and the attachment is performed by a Johnsen-Rahbek force generated between the electrode and the object to be suctioned, and of a gradient force type in which the object to be suctioned is suctioned by a non-uniform electric field.

When the object to be suctioned is a conductor or a semiconductor (silicon wafer), it is preferable to use a Coulomb force type electrostatic chuck or a Johnsen-Rahbek force type electrostatic chuck, and when the object to be suctioned is an insulator such as glass, it is preferable to use a gradient force type electrostatic chuck.

The electrostatic chuck may be formed of one plate or may be formed so as to have a plurality of sub-plates. Further, even when the electrostatic chuck is formed of one plate, it may have a plurality of electric circuits inside the plate and the electrostatic attraction may be controlled so as to be different depending on the position in one plate.

Further, although not shown in FIG. 2, a configuration may be used in which a cooling means (for example, a cooling plate) for suppressing a temperature rise of the substrate W is provided on the side opposite to the suction surface of the substrate suctioner 24 to suppress modification or deterioration of the organic material deposited on the substrate W.

The film forming source 25 includes a crucible (not shown) in which the film forming material that will form a film on the substrate W is accommodated, a heater (not shown) for heating the crucible, a shutter (not shown) that prevents the film forming material from scattering on the substrate until an evaporation rate from the film forming source 25 becomes constant, and the like. The film forming source 25 can have various configurations depending on the application, such as a point film forming source and a linear film forming source.

The film forming source 25 may include a plurality of crucibles for accommodating different film forming materials. In such a configuration, a plurality of crucibles for storing different film-forming materials may be movably installed at film forming positions so that the film forming material can be changed without opening the vacuum container 21 to the atmosphere.

The magnetic force applying means 26 is for pulling the mask M toward the substrate W side by a magnetic force during the film forming step and is installed to be movable up and down in the vertical direction. For example, the magnetic force applying means 26 is configured of an electromagnet and/or a permanent magnet.

Although not shown in FIG. 2, the film forming device 11 may include a film thickness monitor (not shown) and a film thickness calculation unit (not shown) for measuring the thickness of the film vapor-deposited on the substrate.

A magnetic force applying means raising/lowering mechanism 261 for raising and lowering the magnetic force applying means 26 is installed on the upper outer side (atmosphere side) of the vacuum container 21.

The film forming device 11 according to one embodiment of the present disclosure further includes an alignment camera unit 27 that is installed on the upper outer side (atmosphere side) of the vacuum container 21 for capturing an image of alignment marks formed on the substrate W and the mask M.

In the present example, the alignment camera unit 27 can include a rough alignment camera that is used for roughly adjusting the relative positions of the substrate W and the mask M, and a fine alignment camera that is used for adjusting the relative positions of the substrate W and the mask M with high accuracy. The rough alignment camera has a relatively wide viewing angle and low resolution, and the camera for fine alignment has a relatively narrow viewing angle but high resolution.

The rough alignment camera and the fine alignment camera are installed at positions corresponding to the alignment marks formed on the substrate W and the mask M. For example, four fine alignment cameras are installed to form four corners of a rectangle, and the rough alignment camera is installed at the center of two opposite sides of the rectangle. However, the present disclosure is not limited to this configuration, and other arrangements may be used according to the positions of the alignment marks of the substrate W and the mask M.

As shown in FIG. 2, the alignment camera unit 27 of the film forming device 11 according to one embodiment of the present disclosure captures an image of an alignment mark from the upper atmosphere side of the vacuum container 21 through a vacuum-compatible cylinder 214 provided in the vacuum container 21. In this way, the alignment camera is installed so as to enter the inside of the vacuum container 21 through the vacuum-compatible cylinder, thereby making it possible to adjust the focus on the alignment marks formed on the substrate W and the mask M even when the substrate W and the mask M are supported at a relatively large distance from the reference frame 215 due to the interposition of the fine movement stage mechanism 22. The position of the lower end of the vacuum-compatible cylinder can be determined, as appropriate, according to the depth of focus of the alignment camera and the distance of the substrate W/mask M from the reference frame 215.

Although not shown in FIG. 2, since the inside of the vacuum container 21 sealed during the film forming step is dark, an illumination light source that illuminates the alignment marks from below may be installed in order to capture the images of the alignment marks with the alignment camera inserted into the vacuum container 21.

The film forming device 11 includes a control unit (not shown). The control unit has functions of controlling the transport and alignment of the substrate W/mask M, controlling the formation of the film, and the like. Further, the control unit may have a function of controlling the voltage application to the electrostatic chuck.

The control unit can be configured of, for example, a computer having a processor, a memory, a storage, an I/O, and the like. In this case, the functions of the control unit are realized by the processor executing the program stored in the memory or the storage. As the computer, a general-purpose personal computer may be used, or an embedded computer or a PLC (Programmable Logic Controller) may be used. Alternatively, some or all of the functions of the control unit may be configured by a circuit such as an ASIC or FPGA. Further, a control unit may be installed for each film forming device, or one control unit may be configured to control a plurality of film forming device.

Rough Alignment Mechanism

Hereinafter, the rough alignment mechanism according to one embodiment of the present disclosure will be described with reference to FIG. 2.

The rough alignment operation indicates an operation of moving the alignment marks formed on the substrate W and the mask M within the field of view of the fine alignment camera in the alignment camera unit 27, and refers to a rough alignment mechanism for performing the rough alignment operation.

The rough alignment mechanism in the present disclosure includes: the receiving claw 28 (grasping means) that can support the substrate W and the mask M during the rough alignment operation and has a drive mechanism allowing the receiving claw to be at two positions, namely, the receiving position of the substrate W or the mask M and the retracted position in which interference with the substrate W or the mask M is avoided; the mask stand 23 to which the receiving claw 28 is attached and which supports the mask M during the film forming process; the coarse movement stage mechanism 232 (horizontal coarse movement stage mechanism) that can move the receiving claw 28 and the mask stand 23 in the plane direction (XYθ direction) so as to move (adjust) the alignment marks formed on the substrate W and the mask M within the field of view of the fine alignment camera; the coarse movement Z stage mechanism 233 (vertical coarse movement stage mechanism) that supports the coarse movement stage mechanism 232 and moves the coarse movement stage mechanism in the vertical direction; and the mask receiving pin 281 that temporarily supports the mask M when the mask M is transferred from the receiving claw 28 to the mask stand 23.

Fine Movement Stage Mechanism

Hereinafter, the fine movement stage mechanism 22 according to one embodiment of the present disclosure will be described with reference to FIGS. 3A to 3D, 4A, 4B, and 5.

FIGS. 3A to 3D are schematic plan views and schematic cross-sectional views of the fine movement stage mechanism 22 according to one embodiment of the present disclosure.

As described above, the fine movement stage mechanism 22 includes the stage reference plate section 221 that functions as a fixed stand, the fine movement stage plate section 222 that functions as a movable stand, and the magnetic levitation unit 223 for causing the fine movement stage plate section 222 to magnetically levitate and move with respect to the stage reference plate section 221.

The stage reference plate section 221 is a member that serves as a reference for the movement of the fine movement stage plate section 222, and is installed so that the position thereof is fixed. For example, as shown in FIG. 2, the stage reference plate section 221 is installed so as to be fixed to the reference frame 215 of the vacuum container 21 in parallel with the XY plane.

Since the stage reference plate section 221 is a member that serves as a reference for the movement of the fine movement stage plate section 222, the stage reference plate section is preferably installed so as to be prevented by the stretchable member 213, the vibration isolation unit 216, and the like from being affected by disturbances such as vibrations from the vacuum pump or the foundation.

The fine movement stage plate section 222 is movably installed with respect to the stage reference plate section 221, and a substrate suctioner 24 such as an electrostatic chuck is installed on one main surface (for example, the lower surface) of the fine movement stage plate section 222. Therefore, the position of the substrate suctioner 24 and the substrate W suctioned thereto can be adjusted by moving the fine movement stage plate section 222.

The magnetic levitation unit 223 according to one embodiment of the present disclosure includes a magnetic levitation linear motor 31 for generating a driving force for moving the fine movement stage plate section 222, which is a movable stand, with respect to the stage reference plate section 221, which is a fixed stand, a position measuring means for measuring the position of the fine movement stage plate section 222, a self-weight compensating means 33 for compensating the gravity force applied to the fine movement stage plate section 222 by providing a levitation force that causes the fine movement stage plate section 222 to levitate with respect to the stage reference plate section 221, and an origin positioning means 34 for determining the origin position of the fine movement stage plate section 222.

Figure 3A:
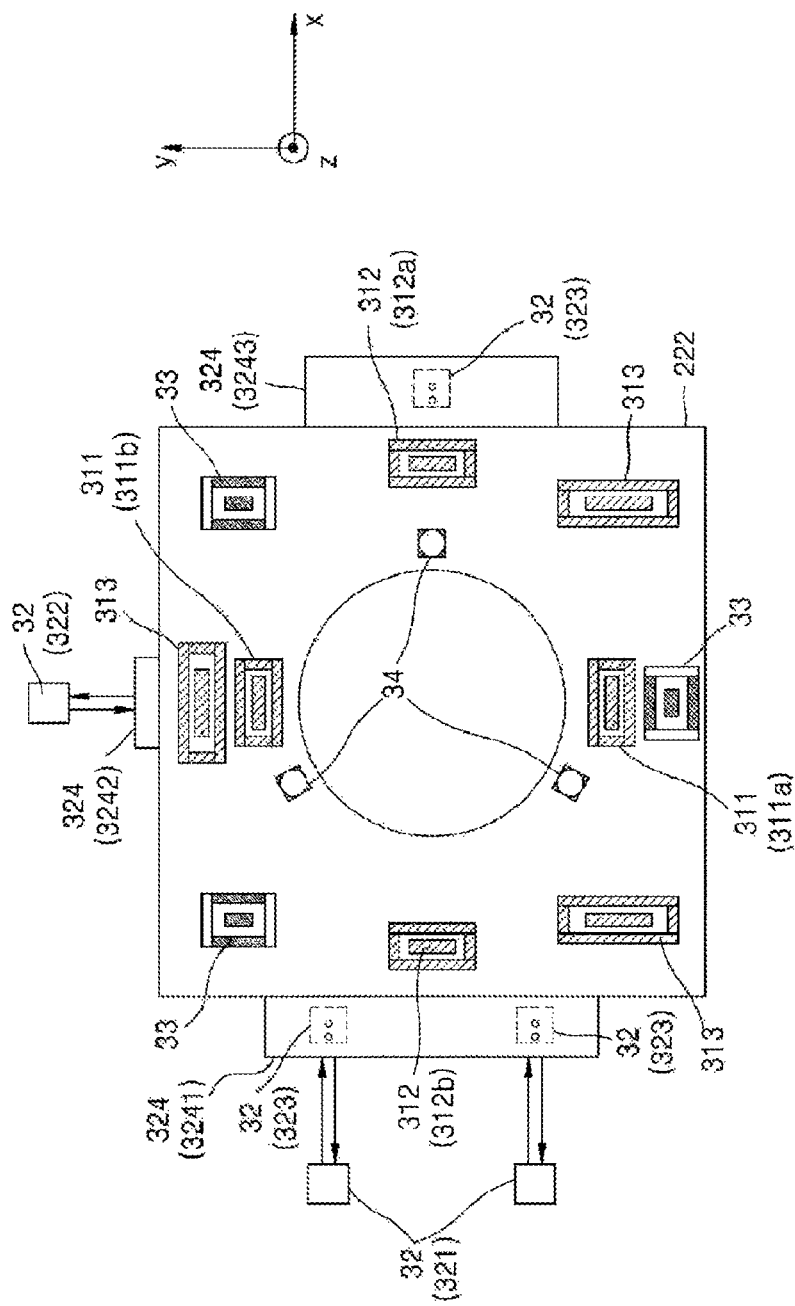
FIG. 3A is a schematic drawing of a fine movement stage mechanism according to one embodiment of the present disclosure.

The magnetic levitation linear motor 31 is a drive source for generating a driving force for moving the fine movement stage plate section 222, and for example, as shown in FIG. 3A, the magnetic levitation linear motor includes two X-direction magnetic levitation linear motors 311 that generate a driving force for moving the fine movement stage plate section 222 in the X direction, two Y-direction magnetic levitation linear motors 312 that generate a driving force for moving the fine movement stage plate section 222 in the Y direction, and three Z-direction magnetic levitation linear motors 313 that a generate a driving force for moving the fine movement stage plate section 222 in the Z direction.

By using the plurality of magnetic levitation linear motors 31, it is possible to move the fine movement stage plate section 222 with six degrees of freedom (X direction, Y direction, Z direction, $\theta_X$ direction, $\theta_Y$ direction, $\theta_Z$ direction).

For example, the translational movement in the X, Y, and Z directions can be realized by driving the X-direction magnetic levitation linear motor 311, the Y-direction magnetic levitation linear motor 312, and the Z-direction magnetic levitation linear motor 313 in the same direction.

The rotational movement in the $\theta_Z$ direction can be realized by adjusting the drive directions of the two X-direction magnetic levitation linear motors 311 and the two Y-direction magnetic levitation linear motors 312. For example, the fine movement stage plate section 222 can be rotationally moved counterclockwise around the Z axis by driving the X-direction magnetic levitation linear motor 311a in the +X direction, the X-direction magnetic levitation linear motor 311b in the −X direction, the Y-direction magnetic levitation linear motor 312a in the +Y direction, and the Y-direction magnetic levitation linear motor 312bb in the −Y direction.

Similarly, the movement in the $\theta_X$ direction and the $\theta_Y$ direction can be realized by adjusting the drive directions of the three Z-direction magnetic levitation linear motors 313.

The number and arrangement of the magnetic levitation linear motors 31 shown in FIG. 3A are exemplary, the present disclosure is not limited thereto, and other numbers and arrangements may be used as long as the fine movement stage plate section 222 can be moved in a desired direction.

Figure 4A:
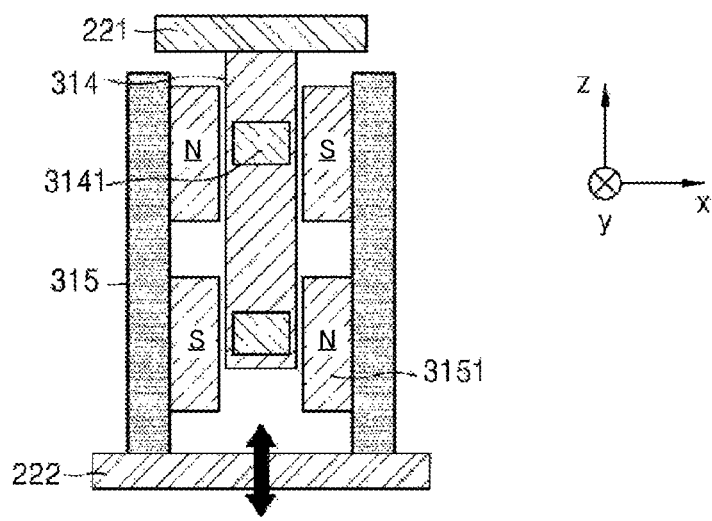
FIG. 4A and FIG. 4B are schematic drawings showing the structure of a magnetic levitation linear motor according to one embodiment of the present disclosure.
Figure 4B:
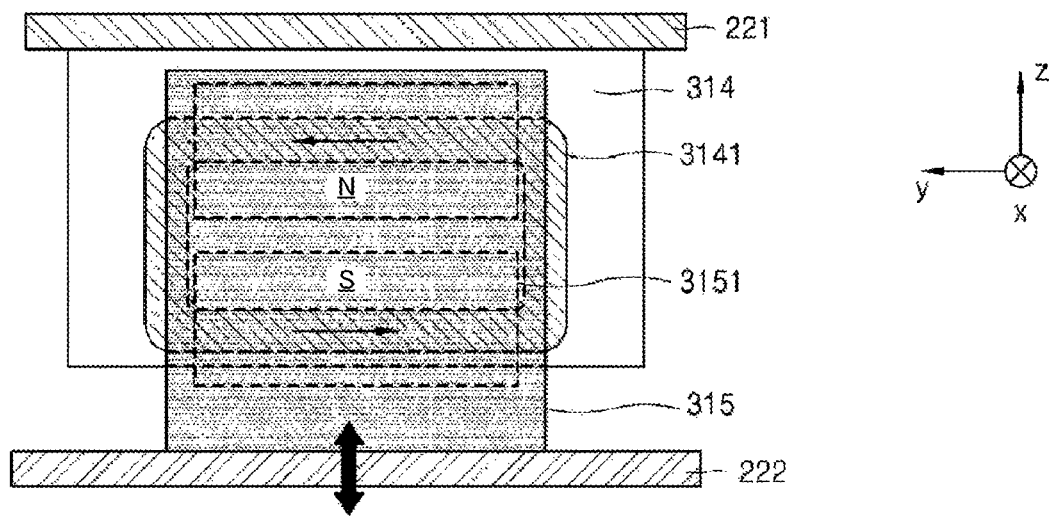
Figure 4C:
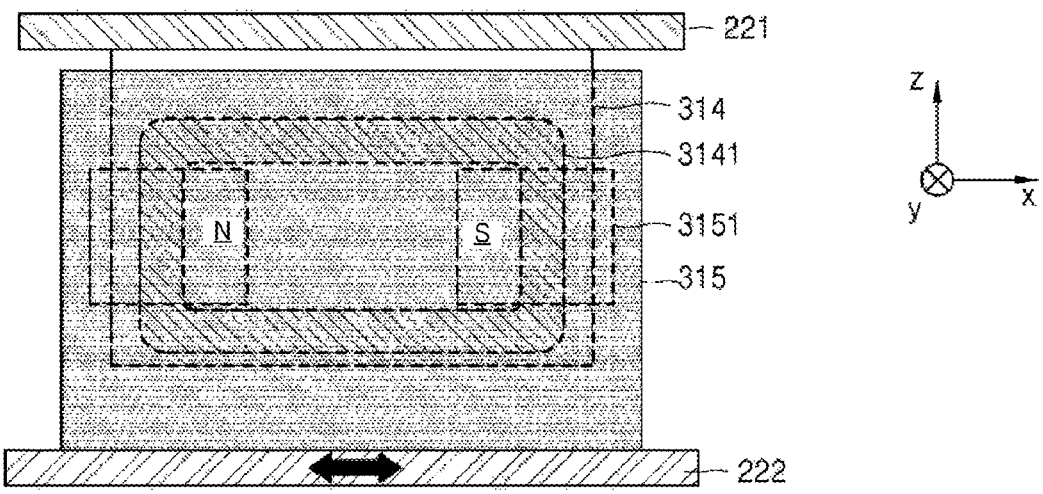
FIG. 4C and FIG. 4D are schematic drawings showing the structure of a magnetic levitation linear motor according to one embodiment of the present disclosure.
Figure 4D:
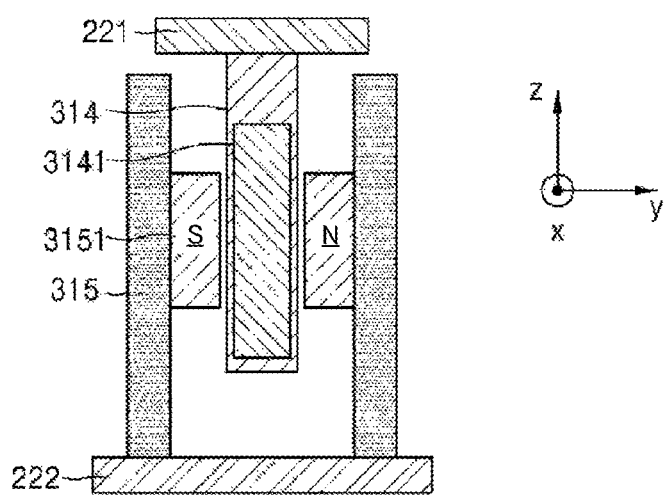

FIG. 4A and FIG. 4B are schematic drawings showing the structure of the Z-direction magnetic levitation linear motor 313, and FIG. 4C and FIG. 4D are schematic drawings showing the structure of the X-direction and Y-direction magnetic levitation linear motors 311 and 312.

The magnetic levitation linear motor 31 includes a stator 314 installed on the stage reference plate section 221 and a mover 315 installed on the fine movement stage plate section 222.

As shown in FIGS. 4A and 4B, the stator 314 of the magnetic levitation linear motor 31 includes a magnetic field generating means, for example, a coil 3141 through which a current flows, and the mover 315 includes a magnetic material, for example, a permanent magnet 3151.

The magnetic levitation linear motor 31 applies a driving force to the permanent magnet 3151 of the mover 315 by the magnetic field generated by passing an electric current through the coil 3141 of the stator 314. The magnetic levitation linear motor 31 can adjust the direction of the force applied to the permanent magnet 3151, which is the mover 315, by adjusting the direction of the current flowing through the stator 314.

For example, as shown in FIG. 4B, where the direction of the current flowing through the coil 3141 of the stator 314 is counterclockwise, since an N pole is induced on the left side (−X side) and an S pole is induced on the right side (+X side) of the coil 3141 in FIG. 4A, the mover 315 receives a force in the downward (−Z) direction. Conversely, where the direction of the current flowing through the coil 3141 is clockwise, the mover 315 can be moved upward (+Z).

Similarly, the X-direction magnetic levitation linear motor 311 and the Y-direction magnetic levitation linear motor 312 shown in FIG. 4C and FIG. 4D also can move the mover 315 in the X direction and Y direction, respectively, by controlling the direction of the current flowing through the coil 3141 of the stator 314.

The position measuring means of the magnetic levitation unit 223 according to one embodiment of the present disclosure is for measuring the position of the fine movement stage plate section 222 and includes a laser interferometer 32 and a reflecting unit 324 installed at the fine movement stage plate section 222 so as to face the laser interferometer. The reflecting unit 324 can be, for example, a plane mirror.

The laser interferometer 32 measures the position of the reflecting unit 324 (the position of the fine movement stage plate section 222) by irradiating the reflecting unit 324 installed on the fine movement stage plate section 222 with a measurement beam and detecting the reflected beam. More specifically, the laser interferometer 32 can measure the position of the fine movement stage plate section 222 on the basis of the interference light between the reflected light of the measurement beam and the reflected light of the reference beam.

The position measuring means of the magnetic levitation unit 223 according to one embodiment of the present disclosure has an X-direction position measuring unit for measuring the position of the fine movement stage plate section 222 in the X direction, a Y-direction position measuring unit for measuring the position in the Y direction, and a Z-direction position measuring unit for measuring the position in the Z direction.

As shown in FIG. 3A, the laser interferometer 32 of the position measuring means according to one embodiment of the present disclosure includes two X-direction laser interferometers 321 for detecting the position of the fine movement stage plate section 222 in the X-axis direction, one Y-direction laser interferometer 322 for detecting the position of the fine movement stage plate section 222 in the Y-axis direction, and three Z-direction laser interferometers 323 for detecting the position of the fine movement stage plate section 222 in the Z-axis direction.

Reflecting units 324 that reflect the measurement beams from these laser interferometers 32 are installed on the fine movement stage plate section 222 so as to face the laser interferometers 32. For example, the reflecting units 324 include an X-direction reflecting unit 3241 installed so as to face the X-direction laser interferometer 321, a Y-direction reflecting unit 3242 installed so as to face the Y-direction laser interferometer 322, and a Z-direction reflecting unit 3243 installed so as to face the Z-direction laser interferometer 323.

The X-direction position measuring unit includes the X-direction laser interferometer 321 and the X-direction reflecting unit 3241, the Y-direction position measuring unit includes the Y-direction laser interferometer 322 and the Y-direction reflecting unit 3242, and the Z-direction position measuring unit includes the Z-direction laser interferometer 323 and the Z-direction reflecting unit 3243.

In the example shown in FIG. 3A, the X-direction reflecting unit 3241 and the Z-direction reflecting unit 3243 are plane mirrors installed on the side surface and the upper surface of one member, but the present disclosure is not limited to such a configuration, and other structures and arrangements may be used as long as the respective reflecting units 324 can reflect the measurement beams from the facing laser interferometers 32 and return the reflected beams to the laser interferometers 32.

With such a configuration of the position measuring means, the position of the fine movement stage plate section 222 can be accurately measured with six degrees of freedom. That is, the X-direction laser interferometer 321, the Y-direction laser interferometer 322, and the Z-direction laser interferometer 323 can measure the X-direction position, the Y-direction position, and the Z-direction position of the fine movement stage plate section 222. Further, by installing a plurality of X-direction laser interferometers 321, it is also possible to measure the position in the rotation ($\theta_Z$) direction about the Z-axis. Further, by installing a plurality of Z-direction laser interferometers 323, the position in the rotation direction ($\theta_X$ or $\theta_Y$) about the X-axis and/or the Y-axis (that is, the inclination angle of the fine movement stage plate section 222) can also be measured.

Figure 3B:
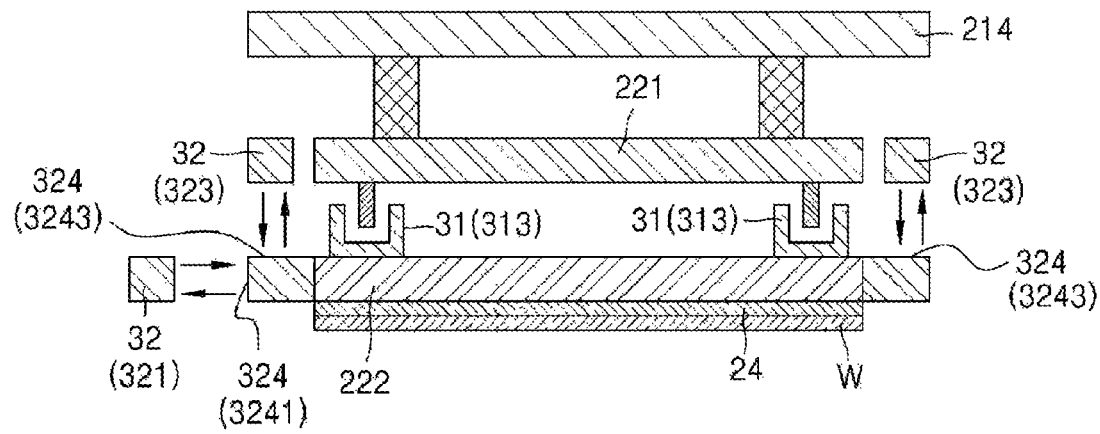
FIG. 3B is a schematic drawing of a fine movement stage mechanism according to one embodiment of the present disclosure.

However, the present disclosure is not limited to the number and arrangement of the laser interferometers 32 and the reflecting units 324 shown in FIGS. 3A and 3B, and other numbers and arrangements may be used as long as the position of the fine movement stage plate section 222 can be measured with six degrees of freedom (X, Y, Z, $\theta_X$, $\theta_Y$, $\theta_Z$). For example, instead of installing only one X-direction laser interferometer, two Y-direction laser interferometers may be installed.

The control unit of the film forming device 11 according to one embodiment of the present disclosure controls the magnetic levitation linear motor 31 on the basis of position information of the fine movement stage plate section 222 (or the substrate suctioner 24 installed thereon) measured by the laser interferometers 32. For example, the control unit of the film forming device 11 moves the fine movement stage plate section 222 or the substrate suctioner 24 to the positioning target position determined by the position of the fine movement stage plate section 222 or the substrate suctioner 24 measured by the laser interferometers 32 and the relative misalignment amount between the substrate W and the mask M measured by the alignment camera unit 27. As a result, the position of the fine movement stage plate section 222 or the substrate suctioner 24 can be controlled with high accuracy in nanometer units.

In the present example, the configuration using laser interferometers, which is a means for measuring the position of the fine movement stage plate section 222, has been described, but the present disclosure is not limited to this means and other position measuring means may be used as long as the position of the fine movement stage plate section 222 can be measured.

Figure 5:
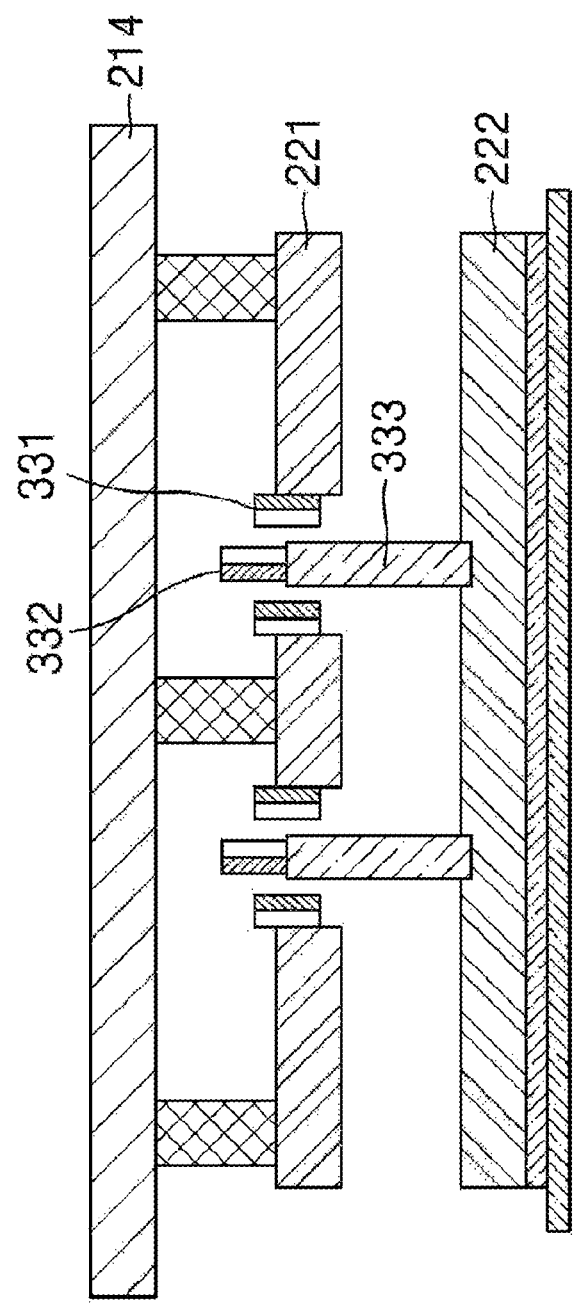
FIG. 5 is a schematic drawing showing the structure of a self-weight compensating means according to one embodiment of the present disclosure.

The self-weight compensating means 33 is a means for compensating for the weight of the fine movement stage plate section 222. For example, the self-weight compensating means 33 according to one embodiment of the present disclosure provides a levitation force of a magnitude corresponding to the gravity force applied to the fine movement stage plate section 222 by using a repulsive force or attractive force between a first magnet portion 331 provided on the stage reference plate section 221 side and a second magnet portion 332 provided on the fine movement stage plate section 222 side as shown in FIGS. 3D and 5.

The first magnet portion 331 and the second magnet portion 332 can be composed of an electromagnet or a permanent magnet.

Figure 3C:
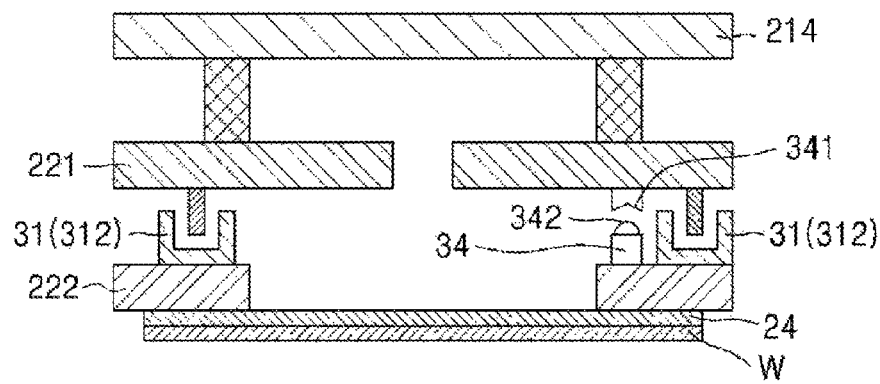
FIG. 3C is a schematic drawing of a fine movement stage mechanism according to one embodiment of the present disclosure.
Figure 3D:
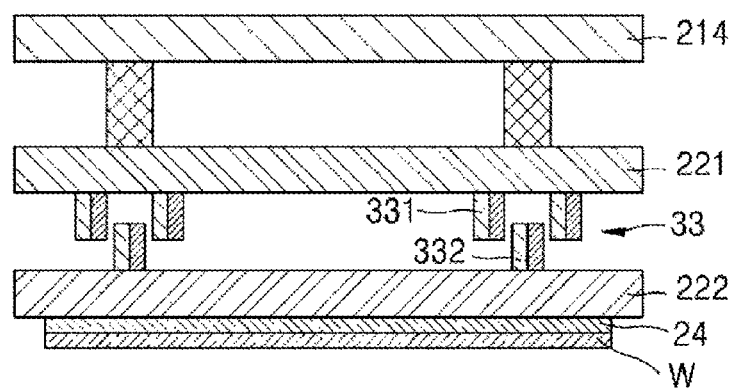
FIG. 3D is a schematic drawing of a fine movement stage mechanism according to one embodiment of the present disclosure.

For example, as shown in FIG. 3D, the first magnet portion 331 provided on the stage reference plate section 221 side and the second magnet portion 332 provided on the fine movement stage plate section 222 side can be attracted upward to offset the gravity force applied to the fine movement stage plate section 222 by arranging the first magnet portion 331 provided on the stage reference plate section 221 side and the second magnet portion 332 provided on the fine movement stage plate section 222 side so that the magnetic poles of opposite polarities face each other.

Alternatively, the gravity force of the fine movement stage plate section 222 can be offset by the repulsive force between the first magnet portion 331 provided on the stage reference plate section 221 side and the second magnet portion 332 provided on the fine movement stage plate section 222 side.

For example, as shown in FIG. 5, the first magnet portion 331 and the second magnet portion 332 may be arranged so that magnetic poles having the same polarity face each other, and a spacer 333 extending in the Z direction may be interposed between the fine movement stage plate section 222 and the second magnet portion 332 and installed so that the lower end of the second magnet portion 332 becomes higher than the lower end of the first magnet portion 331. In other words, the length of the spacer 333 in the Z direction is set so that the lower end of the second magnet portion 332 provided on the fine movement stage plate section 222 side is higher than the lower end of the first magnet portion 331 provided on the stage reference plate section 221 (in other words, farther from the fine movement stage plate section 222).

With such a configuration, the second magnet portion 332 provided on the fine movement stage plate section 222 side receives an upward repulsive force from the first magnet portion 331 provided on the stage reference plate section 221 side, and the gravity force applied to the fine movement stage plate section 222 can be offset.

As shown in FIG. 3A, the self-weight compensating means 33 is preferably installed at at least three positions in the XY plane so that the fine movement stage plate section 222 can be supported more stably. For example, it is preferable to install the self-weight compensating means symmetrically around the center of gravity of the fine movement stage plate section 222.

As described above, in the film forming device 11 according to one embodiment of the present disclosure, the load of the magnetic levitation linear motor 31 can be reduced and the heat generated from the magnetic levitation linear motor 31 can be reduced by adopting the self-weight compensating means 33. As a result, it is possible to prevent the organic material deposited on the substrate W from being thermally modified.

That is, where the weight of the fine movement stage plate section 222 is to be supported only by the Z-direction magnetic levitation linear motor 313 without using the self-weight compensating means 33, an excessive load is applied to the Z-direction magnetic levitation linear motor 313 and considerable heat is generated which may result in modification of the organic material deposited on the substrate W. In the present example, since the gravity force applied to the fine movement stage plate section 222 is offset by the self-weight compensating means 33, the Z-direction magnetic levitation linear motor 313 may provide only the driving force for fine movement in the Z direction to the fine movement stage plate section 222 levitated by the self-weight compensating means 33, thereby reducing the load.

In one example of the present disclosure, the self-weight compensating means 33 is realized by a magnet, but the present disclosure is not limited to this configuration, and other configurations can be used as long as the gravity force of the fine movement stage plate section 222 can be offset to enable levitation.

The origin positioning means 34 of the magnetic levitation unit 223 according to one embodiment of the present disclosure is a means for determining the origin position of the fine movement stage plate section 222 and can be configured of a kinematic coupling including a triangular pyramid-shaped recess 341 and a hemispherical convex portion 342.

For example, as shown in FIG. 3C, the triangular pyramid-shaped recess 341 is provided on the stage reference plate section 221 side, and the hemispherical convex portion 342 is provided on the fine movement stage plate section 222 side. Where the hemispherical convex portion 342 is inserted into the triangular pyramid-shaped recess 341, the hemispherical convex portion 342 contacts the inner surface of the triangular pyramid-shaped recess 341 at three fulcrums, thereby determining the position of the fine movement stage plate section 222.

As shown in FIG. 3A, three such kinematic coupling type origin positioning means 34 are installed equidistantly (for example, at 120° intervals) and symmetrically around the center of the fine movement stage plate section 222, thereby making it possible to determine a constant position of the center of the fine movement stage plate section 222. That is, the position of the fine movement stage plate section 222 when the fine movement stage plate section 222 is brought close to the stage reference plate section 221 and the convex portion 342 of the three origin positioning means is seated in the recess 341 is measured by the laser interferometers 32 and taken as the origin position.

With the film forming device 11 according to one embodiment of the present disclosure, by adopting three kinematic couplings as the origin positioning means 34, a constant origin position of the fine movement stage plate section 222 can be determined, and the position of the fine movement stage plate section 222 can be controlled more accurately.

Rough Alignment Method

Hereinafter, the rough alignment method that uses the rough alignment mechanism of the present disclosure to adjust the alignment marks formed on the substrate W and the mask M so that the marks are within the field of view of the fine alignment camera will be described for each of the substrate W and the mask M.

First, the rough alignment method of the mask M will be explained.

The mask M is carried into the vacuum container 21 by the transport robot 14 and transferred to the receiving claw 28. The coarse movement Z stage mechanism 233 to which the receiving claw 28 is attached brings the mask M supported by the receiving claw 28 close to the preset measurement distance of the rough alignment camera.

When the mask M reaches the measurement distance of the rough alignment camera, the image of the alignment mark of the mask M is captured by the rough alignment camera, the alignment mark position of the mask M in the XYθ direction in the field of view of the rough alignment camera is measured, and the mask M is moved by the coarse movement stage mechanism 232 on the basis of the measurement result so that the alignment mark of the mask M comes to the center of the field of view of the rough alignment camera.

Next, the mask M supported by the receiving claw 28 is transferred to the mask receiving pin 281 by the coarse movement Z stage mechanism 233. After the mask M is separated from the receiving claw 28 and transferred to the mask receiving pin 281, the receiving claw 28 is moved to the retracted position by the drive mechanism. Further, once the mask M is separated from the receiving claw 28 and transferred to the mask receiving pin 281, the coarse movement stage mechanism 232 moves the position thereof in the XYθ direction to each stroke center (origin). By performing this operation, the position of the mask M in the XYθ direction is always aligned with the stroke center of the coarse movement stage mechanism 232 regardless of the transport position of the mask M by the robot hand.

Next, the coarse movement Z stage mechanism 233 is moved up to receive the mask M from the mask receiving pin 281 and place the mask on the mask installation surface of the mask stand 23, thereby completing the rough alignment of the mask M.

Next, a rough alignment method of the substrate W will be described.

FIGS. 6A to 6E explain a series of operations from carrying the substrate W into the film forming device 11 to completion of rough alignment which are performed in a state in which the alignment mark of the mask M is aligned with the center of the coarse movement stage mechanism 232 by the above-described rough alignment operation.

Figure 6A:
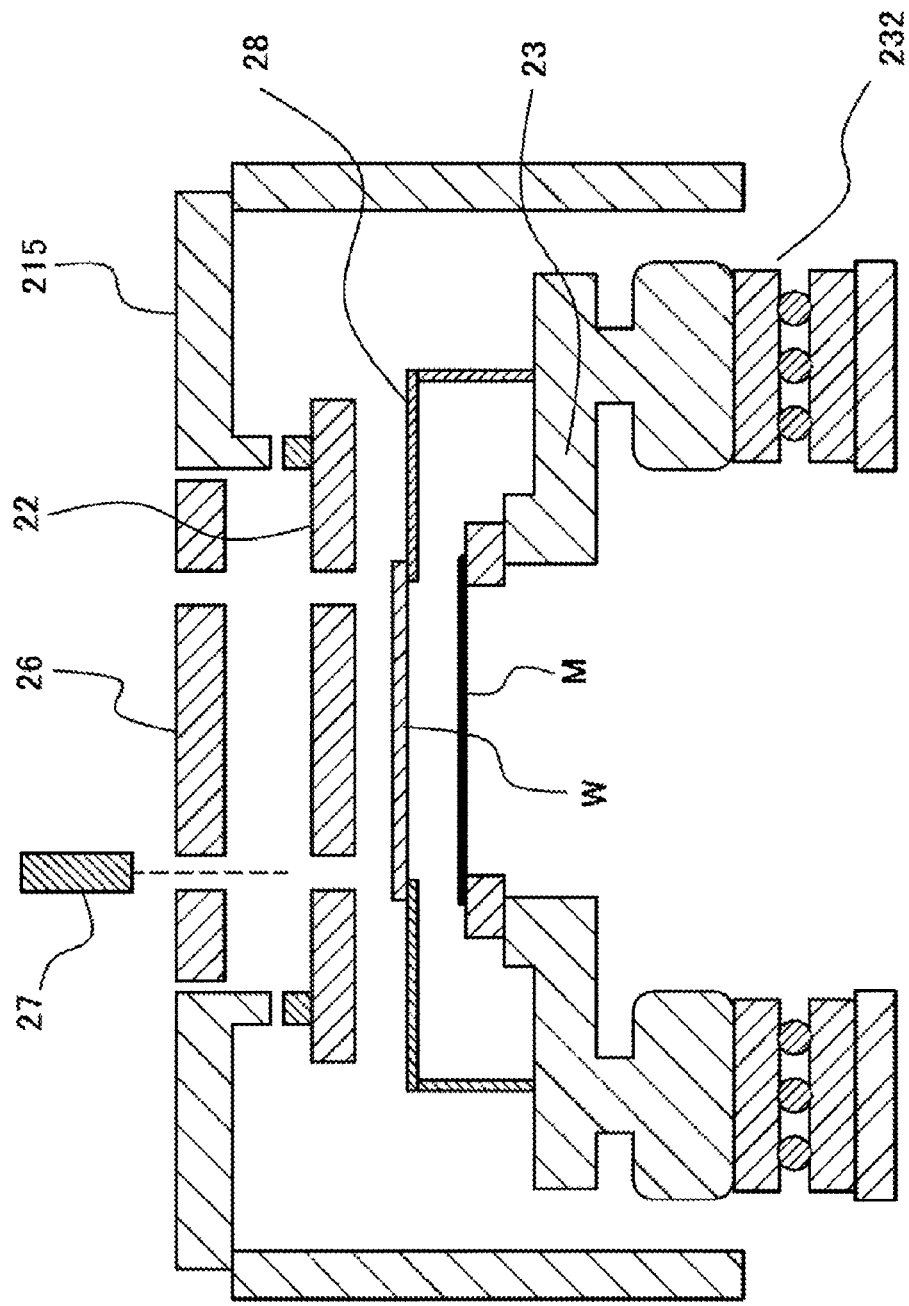
FIG. 6A is a diagram illustrating a series of operations of rough alignment according to one embodiment of the present disclosure.
Figure 6B:
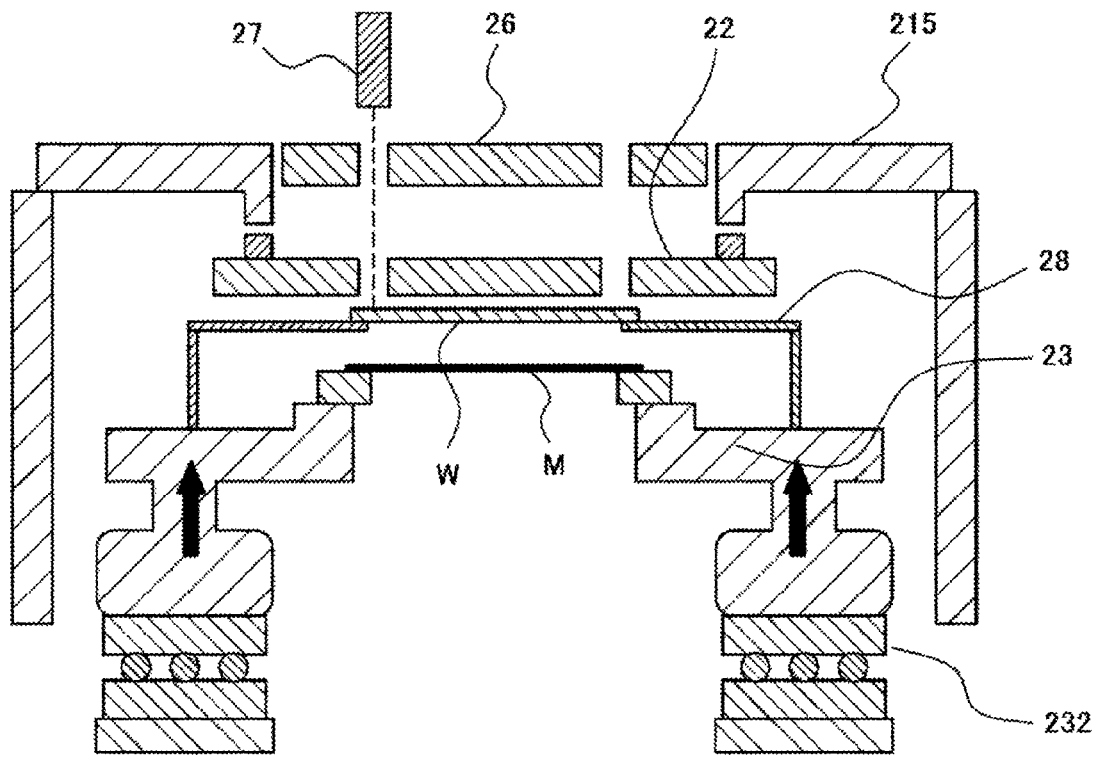
FIG. 6B is a diagram illustrating a series of operations of rough alignment according to one embodiment of the present disclosure.
Figure 6B:
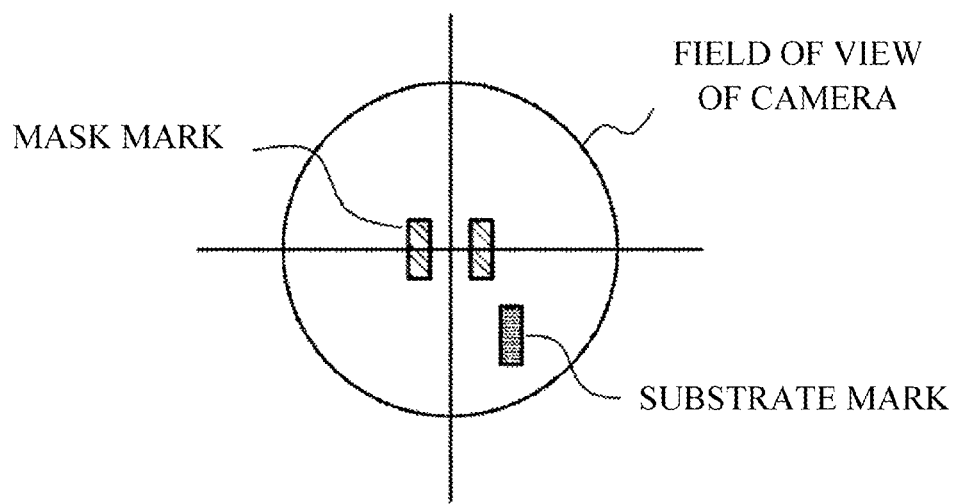
Figure 6C:
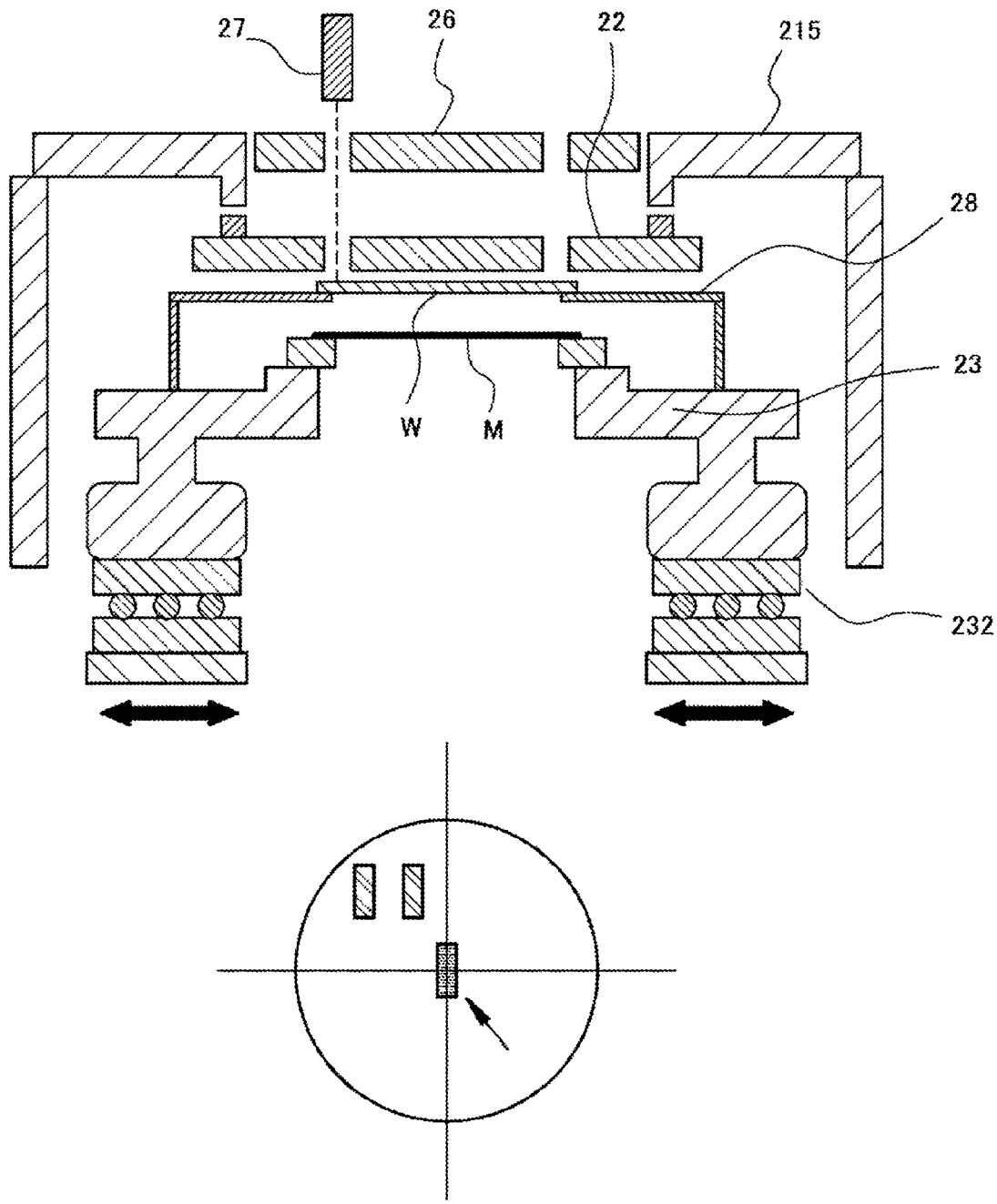
FIG. 6C is a diagram illustrating a series of operations of rough alignment according to one embodiment of the present disclosure.

First, the receiving claw 28 that was moved to the retracted position is returned to the receiving position. In this state, the substrate W is carried into the vacuum container 21 by the transport robot 14 and transferred to the receiving claw 28 (FIG. 6A). Similar to the rough alignment operation of the mask M, the coarse movement Z stage mechanism 233 to which the receiving claw 28 is attached brings the substrate W supported by the receiving claw 28 close to the preset measurement distance of the rough alignment camera. Where the substrate W reaches the measurement distance of the rough alignment camera, the image of the alignment mark of the substrate W is captured by the rough alignment camera, and the alignment mark position of the substrate W in the XYθ direction in the field of view of the rough alignment camera is measured (FIG. 6B). The substrate W is moved by the coarse movement stage mechanism 232 on the basis of the measurement result so that the alignment mark of the substrate W comes to the center of the field of view of the rough alignment camera (FIG. 6C).

Figure 6D:
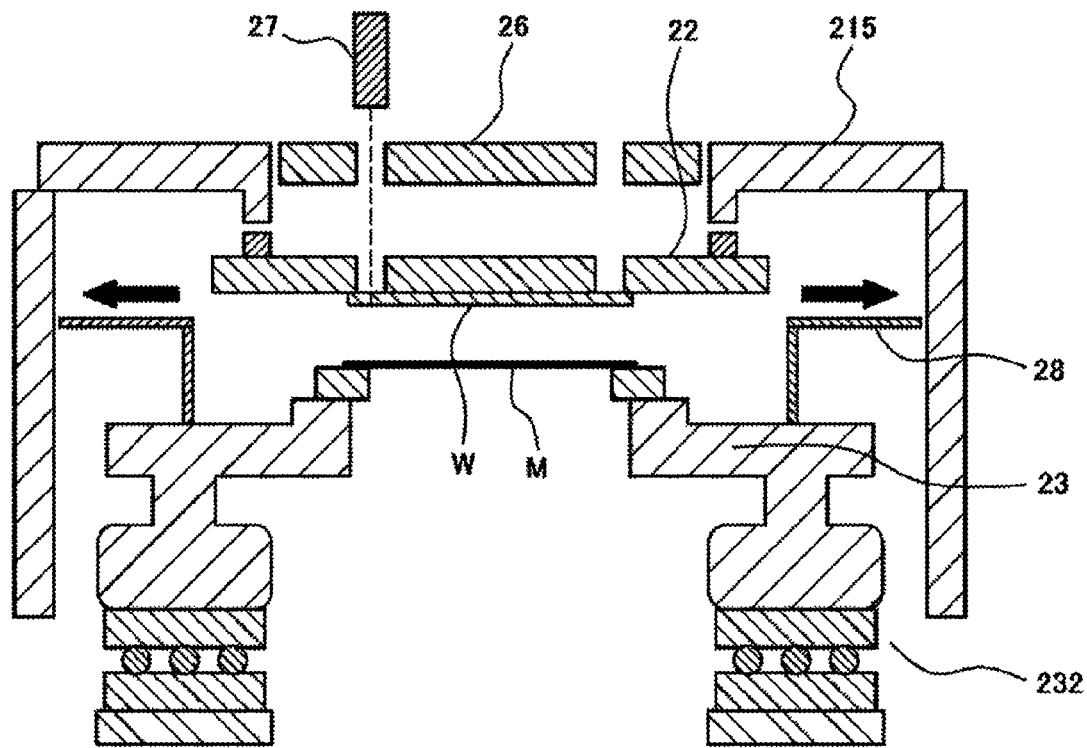
FIG. 6D is a diagram illustrating a series of operations of rough alignment according to one embodiment of the present disclosure.
Figure 6D:
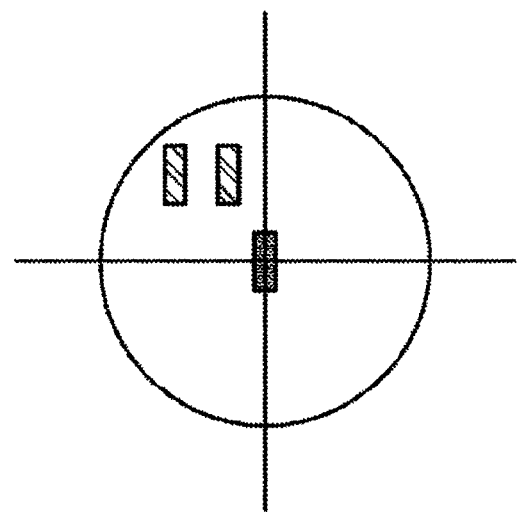

Next, the substrate W supported by the receiving claw 28 is brought by the coarse movement Z stage mechanism 233 sufficiently close to or in contact with the substrate suctioner provided at the fine movement stage mechanism 22, and in this state, a substrate suction voltage is applied to the substrate suctioner and the substrate W is suctioned to the substrate suctioner by electrostatic attraction (FIG. 6D). When the substrate W is suctioned to the substrate suctioner, the entire surface of the substrate W may be suctioned simultaneously to the entire suction surface of the substrate suctioner, or the substrate W may be suctioned in sequence from one region of the plurality of regions of the substrate suctioner toward the other region. The rough alignment of the substrate W is completed by suctioning the substrate W to the substrate suctioner. At this time, a compliance mechanism may be added to the receiving claw 28 for the purpose of cushioning the impact of the substrate W on the substrate suctioner due to contact or collision. After the substrate W is suctioned to the substrate suctioner on the fine movement stage mechanism 22, the receiving claw 28 is moved to the retracted position by the drive mechanism.

Figure 6E:
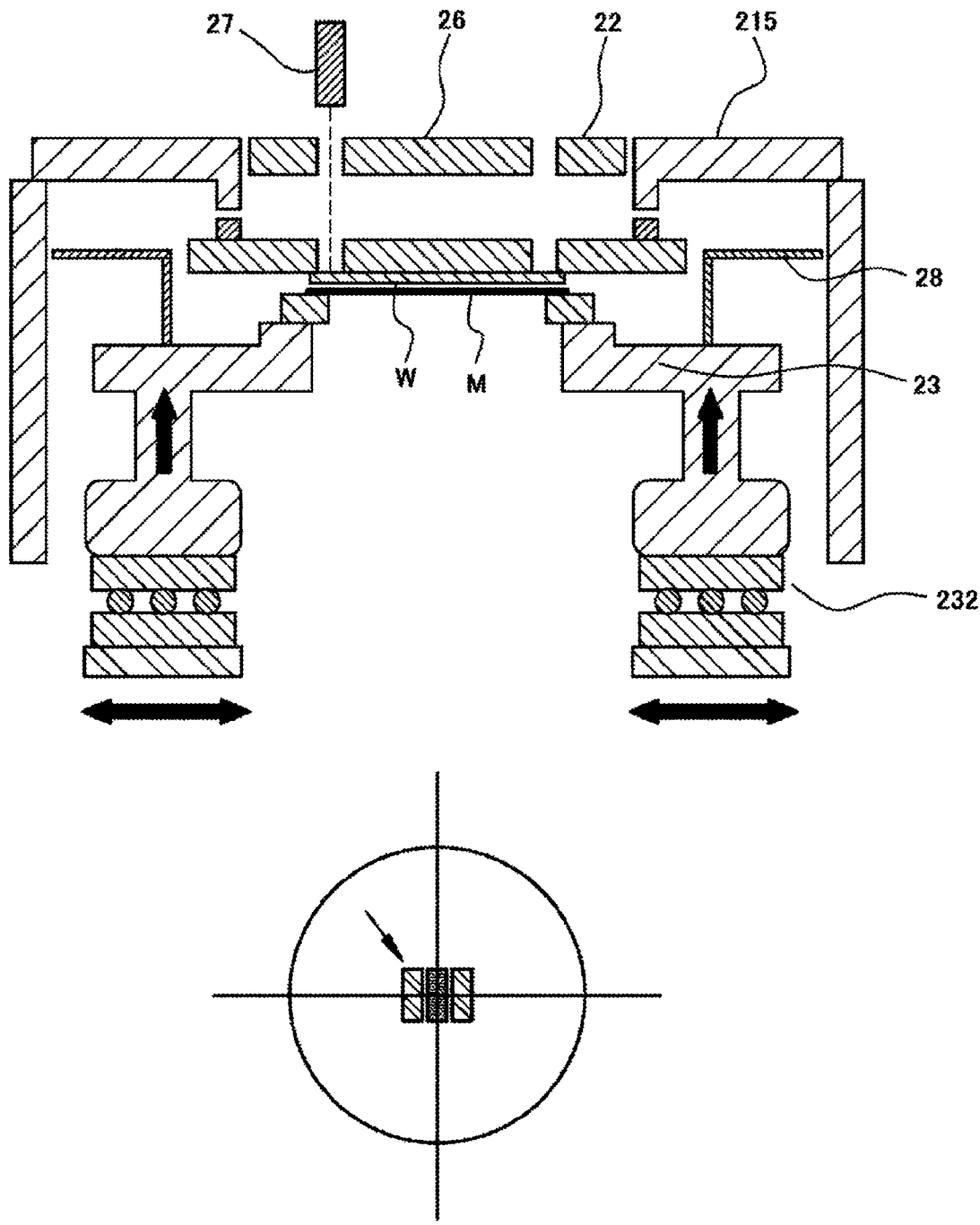
FIG. 6E is a diagram illustrating a series of operations of rough alignment according to one embodiment of the present disclosure.

In the above rough alignment process of the substrate W, the alignment mark of the mask M may move from the position reached upon completion of the previously performed alignment. When the rough alignment of the substrate W is completed, that is, after the substrate W is suctioned to the substrate suctioner on the fine movement stage mechanism 22, the above-mentioned rough alignment operation of the mask M is performed again to move the alignment mark of the mask M, which has moved from the center of the field of view of the alignment camera, to the center of the field of view of the camera again. In other words, after raising the mask M placed on the mask stand 23 to the above-mentioned measurement distance of the rough alignment camera, the position of the alignment mark of the mask M is measured by the rough alignment camera, and the mask M is moved by the coarse movement stage mechanism 232 so that the alignment mark of the mask M is in the center of the field of view of the camera (FIG. 6E). This completes the rough alignment that adjusts the alignment marks formed on the substrate W and the mask M so that the alignment marks are within the field of view of the fine alignment camera.

Fine Alignment Method

The control unit of the film forming device 11 drives the coarse movement Z stage mechanism 233 to bring the substrate suctioner 24 and the mask stand 23 relatively close to each other. At this time, the control unit brings the substrate suctioner 24 and the mask stand 23 relatively close to each other (for example, raises the mask stand 23 or lowers the substrate W) until the distance between the substrate W suctioned by the substrate suctioner 24 and the mask M supported by the mask stand 23 reaches a preset fine alignment measurement distance.

Where the distance between the substrate W and the mask M becomes the fine alignment measurement distance, images of the alignment marks of the substrate W and the mask M are captured by the fine alignment camera, the relative positions of the substrate W and the mask M in the $XY\theta_Z$ direction are measured, and the amount of relative misalignment thereof is calculated based on the measurement results. Where the relative misalignment between the substrate W and the mask M is larger than a predetermined threshold value, the mask M is lowered again (or the substrate W is raised again) to separate the substrate W and the mask M, and then the movement target position of the fine movement stage plate section 222 is calculated based on the position of the fine movement stage plate section 222 measured by the laser interferometers 32 and the relative misalignment between the substrate W and the mask M.

The relative positions of the substrate W and the mask M are adjusted by driving the fine movement stage plate section 222 in the $XY\theta_Z$ direction to the movement target position by the magnetic levitation linear motor 31 while measuring the position of the fine movement stage plate section 222 with the laser interferometers 32 on the basis of the calculated movement target position.

Such a process is repeated until the relative misalignment between the substrate W and the mask M becomes smaller than a predetermined threshold value.

Where the relative misalignment between the substrate W and the mask M becomes smaller than the predetermined threshold value, the substrate W is lowered to assume a vapor deposition position where the film forming surface of the substrate W suctioned to the substrate suctioner 24 is in contact with the upper surface of the mask M.

When the vapor deposition position where the substrate W and the mask M come into contact is reached, the magnetic force applying means 26 is lowered and the mask M is attracted through the substrate W to bring the substrate W and the mask M into close contact with each other.

In this process, in order to confirm whether the misalignment between the substrate W and the mask M in the $XY\theta_Z$ direction has occurred, the relative positions of the substrate W and the mask M are measured using a fine alignment camera, and when the measured relative misalignment amount is equal to or greater than a predetermined threshold value, the substrate W and the mask M are separated (for example, the substrate W is raised) again to a predetermined distance, and then the relative position between the substrate W and the mask M is adjusted and the same process is repeated.

When the relative misalignment amount between the substrate W and the mask M is smaller than the predetermined threshold value while the substrate W and the mask M are located at the vapor deposition position, the alignment step is completed and the film forming step is started.

Film Forming Process

When the relative misalignment amount between the substrate W and the mask M is made smaller than a predetermined threshold value by the alignment method of the present embodiment, the shutter of the film forming source 25 is opened and the film forming material is passed through the mask M to the substrate W to form a film.

After vapor deposition to a desired thickness, the magnetic force applying means 26 is raised to separate the mask M, and the mask stand 23 is lowered.

Next, the hand of the transport robot 14 enters the vacuum container 21 of the film forming device 11, a zero (0) or reverse-polarity substrate separation voltage is applied to the electrode portion of the substrate suctioner 24, and the substrate W is separated from the substrate suctioner 24. The separated substrate W is carried out from the vacuum container 21 by the transport robot 14.

In the above description, the film forming device 11 has a so-called upward vapor deposition configuration (depo-up) in which the film is formed in a state in which the film forming surface of the substrate W faces downward in the vertical direction, but the present disclosure is not limited to such a configuration, and a configuration may be used in which the substrate W is arranged to be vertically erected on the side surface side of the vacuum container 21, and the film is formed in a state in which the film forming surface of the substrate W is parallel to the direction of gravity.

As described above, according to the present disclosure, since the receiving claw as a gripping means for temporarily receiving the substrate and the mask carried into the film forming device can be moved between the receiving position for receiving the substrate and the mask and the retracted position in which the receiving claw does not interfere with the substrate or the mask, and the receiving claw is installed together with the mask stand at the coarse movement stage mechanism, it is not necessary to separately provide a stage mechanism for moving the substrate and a stage mechanism for moving the mask, the rough alignment operation of the substrate and the mask can be performed with a common stage mechanism, and the size and cost of the device can be reduced.

Other Embodiments

The above examples illustrate the present disclosure, and the present disclosure is not limited to the configurations of the above examples and may be appropriately modified within the scope of the technical idea thereof.

Figure 7:
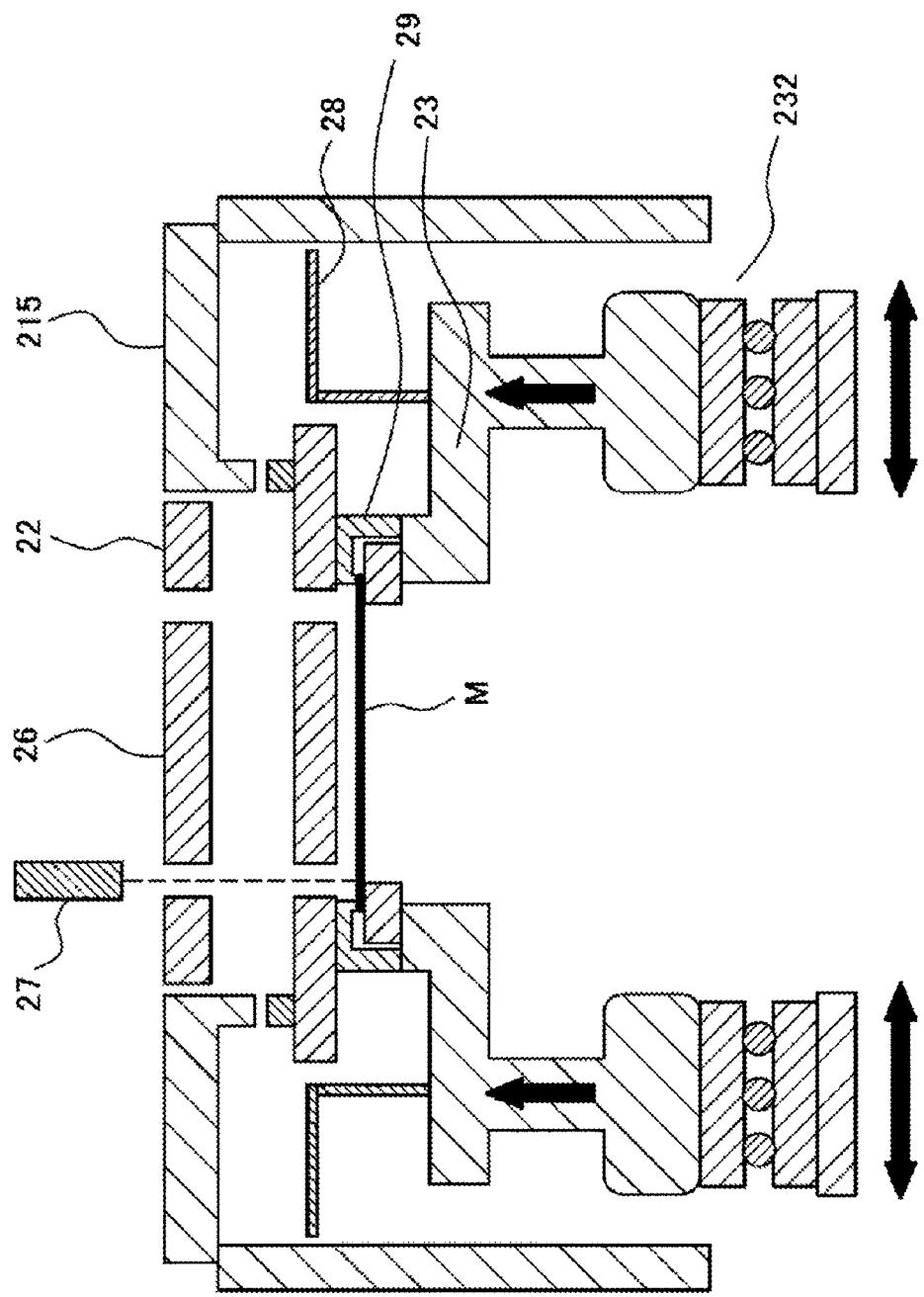
FIG. 7 is a diagram showing a rough alignment mechanism provided with a mask fixing mechanism according to one embodiment of the present disclosure.

For example, as shown in FIG. 7, in the rough alignment mechanism of the present disclosure, a mask fixing mechanism 29 can be further installed on the mask stand 23 in order to prevent the mask M from shaking and displacing on the mask stand 23, during the rough alignment operation described above, or when the mask M is attracted to the substrate W side by the magnetic force applying means 26 after the alignment is completed, or the like.

As shown hereinabove, the mask fixing mechanism 29 prevents the mask M from moving on the mask stand 23 when the mask M is placed on the mask installation surface of the mask stand 23 and the mask stand 23 is moved in this state by the coarse movement stage mechanism 232 or the like for the above-mentioned rough alignment. As a result, the accuracy of the rough alignment operation of the mask M can be further improved.

Figure 8A:
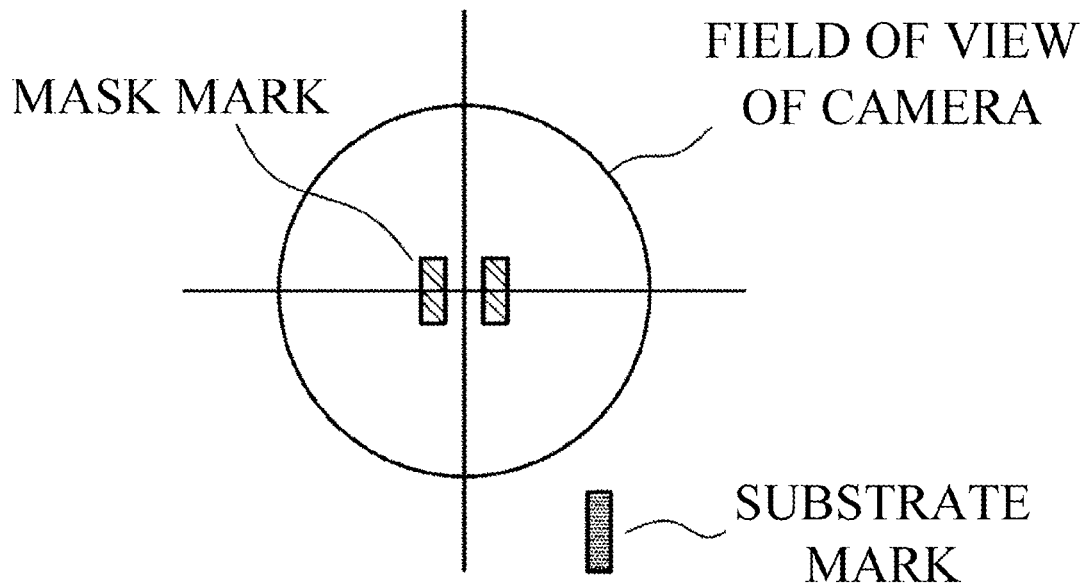
FIG. 8A is a diagram for conceptually explaining an alignment processing procedure using a rough alignment mechanism according to one embodiment of the present disclosure when the alignment mark is greatly deviated from the field of view of the camera.
Figure 8B:
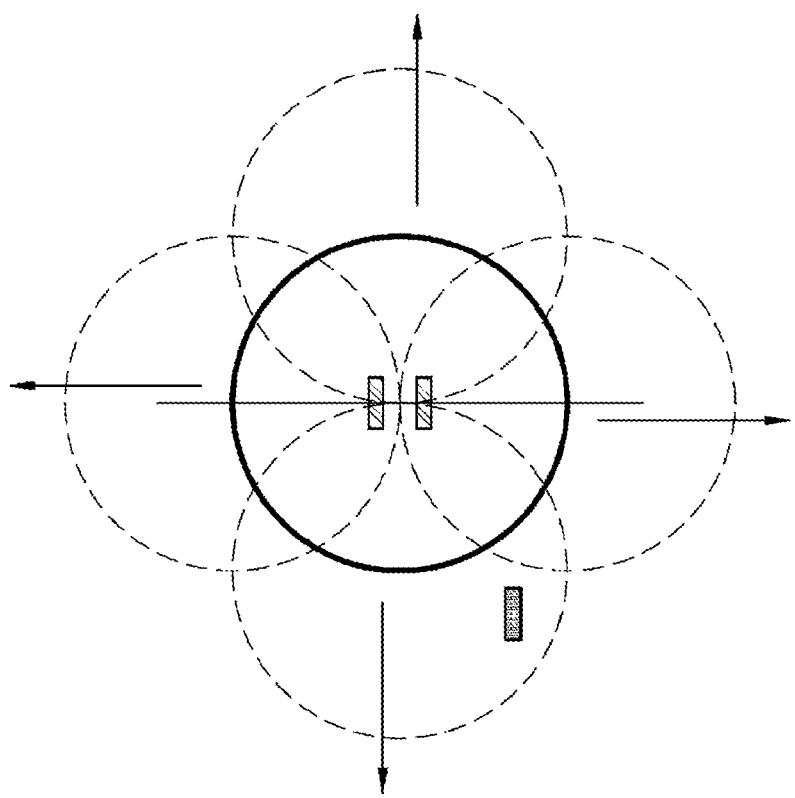
FIG. 8B is a diagram for conceptually explaining an alignment processing procedure using a rough alignment mechanism according to one embodiment of the present disclosure when the alignment mark is greatly deviated from the field of view of the camera.
Figure 8C:
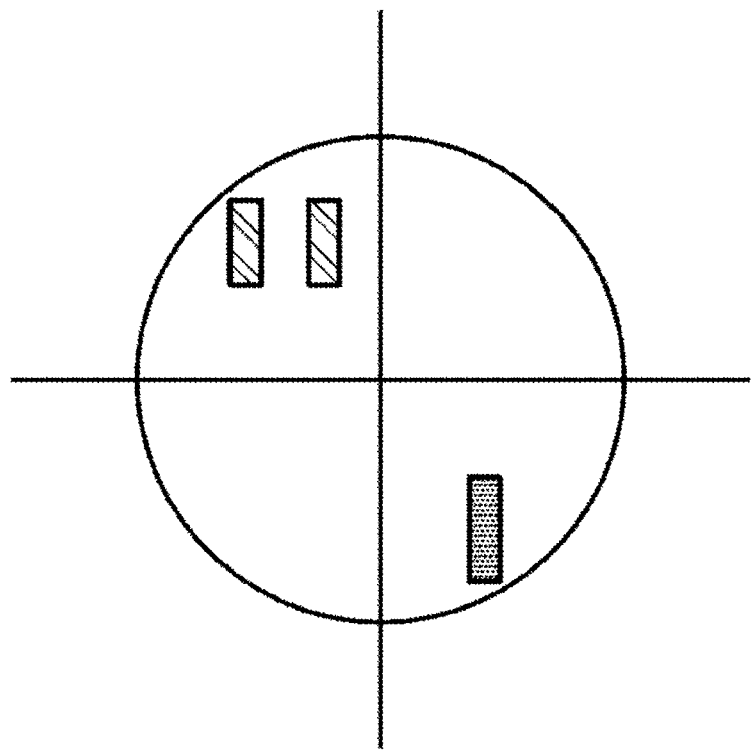
FIG. 8C is a diagram for conceptually explaining an alignment processing procedure using a rough alignment mechanism according to one embodiment of the present disclosure when the alignment mark is greatly deviated from the field of view of the camera.
Figure 8D:
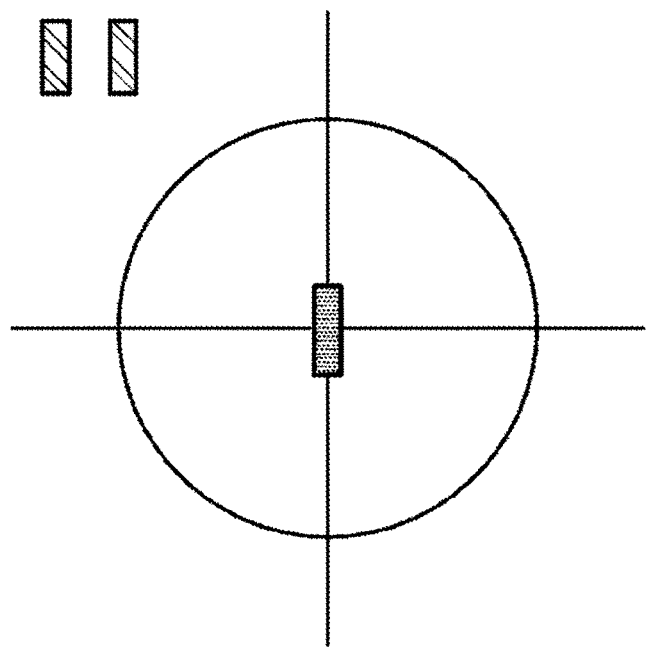
FIG. 8D is a diagram for conceptually explaining an alignment processing procedure using a rough alignment mechanism according to one embodiment of the present disclosure when the alignment mark is greatly deviated from the field of view of the camera.
Figure 8E:
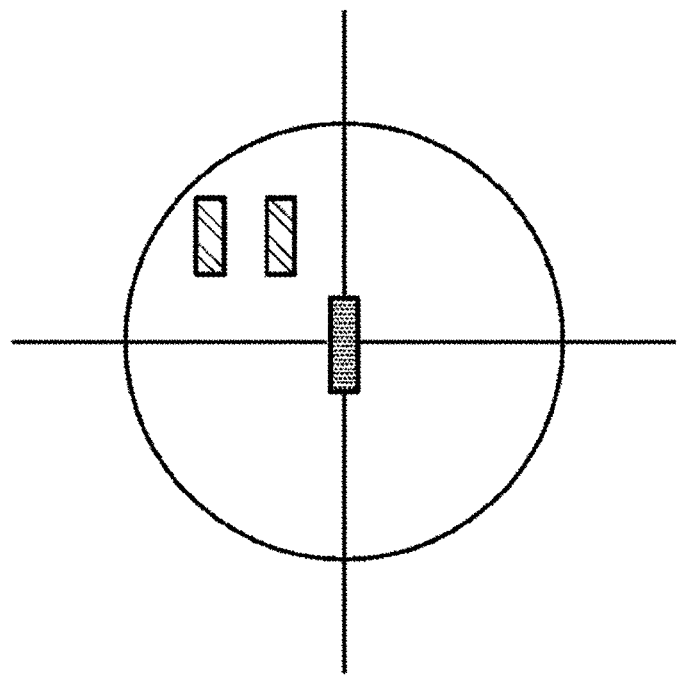
FIG. 8E is a diagram for conceptually explaining an alignment processing procedure using a rough alignment mechanism according to one embodiment of the present disclosure when the alignment mark is greatly deviated from the field of view of the camera.
Figure 8F:
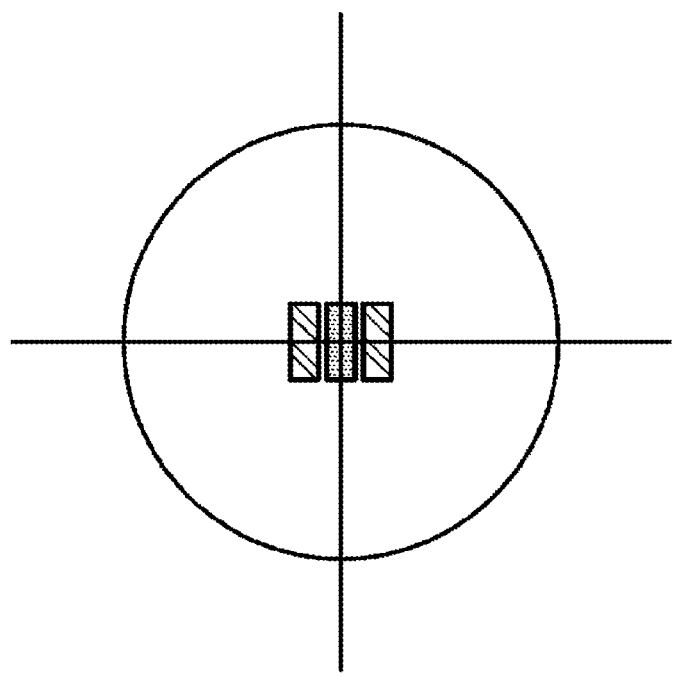
FIG. 8F is a diagram for conceptually explaining an alignment processing procedure using a rough alignment mechanism according to one embodiment of the present disclosure when the alignment mark is greatly deviated from the field of view of the camera.

Further, the rough alignment mechanism of the present disclosure can be suitably used in the case where the alignment mark is greatly deviated from the field of view of the camera at the time of the rough alignment described above. FIGS. 8A to 8F conceptually explain an alignment processing procedure using the rough alignment mechanism of the present disclosure in this case. FIG. 8A corresponds to the above-mentioned FIG. 6B and shows how an image of the substrate W carried into the film forming device 11 is captured at the measurement position for rough alignment in a state where the alignment mark of the mask M is aligned with the center of the coarse movement stage mechanism 232. As shown in the figure, the alignment mark on the substrate W is outside the field of view of the camera and cannot be found. When the alignment mark is not found in the field of view of the camera in this way, the alignment mark of the substrate W is searched while driving the coarse movement stage mechanism 232 back and forth and left and right in the horizontal plane (FIG. 8B). Once the alignment mark of the substrate W is found, the coordinates thereof are calculated, and then the substrate W is suctioned to the substrate suctioner, and in that state, the operation of driving the coarse movement stage mechanism 232 and moving the mask M is repeated, thereby shortening the distance between the alignment mark of the substrate W and the alignment mark of the mask M so that both marks are within the field of view of the camera (FIG. 8C). Where both marks enter the field of view of the camera, the coarse movement stage mechanism 232 is first driven so that the alignment mark of the substrate W comes to the center of the field of view of the camera, and the substrate W that has thus been aligned in position is suctioned to the substrate suctioner (FIG. 8D), then the coarse movement stage mechanism 232 is driven by the same amount of movement in the opposite direction so that the alignment of the mask M returns to the original position in the field of view of the camera (FIG. 8E), and finally the coarse movement stage mechanism 232 is driven so that the alignment mark of the mask M comes to the center of the field of view of the camera (FIG. 8F). As a result, it is possible to realize an alignment operation using the rough alignment mechanism of the present disclosure even when the alignment mark has greatly deviated from the field of view of the camera.

REFERENCE SIGNS LIST

11: film forming device
22: fine movement stage mechanism
23: mask stand
24: substrate suctioner
28: receiving claw (grasping means)
232: coarse movement stage mechanism
233: coarse movement Z stage mechanism
29: mask fixing mechanism

What is claimed is:

1. An alignment method for adjusting positions of a substrate and a mask, the alignment method comprising:
   supporting the substrate by a temporary receiver configured to (i) temporarily support the substrate before the substrate is suctioned by a substrate suctioner configured to suction and hold the substrate and to (ii) temporarily support the mask before the mask is supported by a mask supporter configured to support the mask;
   adjusting a position of the substrate, while the substrate is being supported by the temporary receiver, with respect to the substrate suctioner by driving a horizontal coarse movement stage mechanism configured to move both of (i) the mask supporter, which is configured to support the mask after the mask has been supported by the temporary receiver, and (ii) the temporary receiver, which is configured to temporarily support the substrate before the substrate is suctioned by a substrate suctioner and to temporarily support the mask before the mask is supported by the mask supporter, in a horizontal plane; and
   suctioning the substrate, which has been positionally adjusted by driving a vertical coarse movement stage mechanism that raises and lowers the horizontal coarse movement stage mechanism, with the substrate suctioner.

2. The alignment method according to claim 1, further comprising, before supporting the substrate by the temporary receiver,
   supporting the mask with the temporary receiver;
   adjusting a position of the mask supported by the temporary receiver by driving the horizontal coarse movement stage mechanism to move the mask supporter and the temporary receiver in the horizontal plane; and
   placing the mask, which has been positionally adjusted, on the mask supporter.

3. The alignment method according to claim 2, further including, after the suctioning of the substrate, readjusting the position of the mask placed on the mask supporter by driving the horizontal coarse movement stage mechanism to move the mask supporter and the temporary receiver again in the horizontal plane.

4. The alignment method according to claim 2, wherein the temporary receiver can be at two positions, which are a receiving position in which the temporary receiver can receive the substrate or the mask, and a retracted position in which the temporary receiver can avoid interference with the substrate or the mask; and the temporary receiver is moved from the receiving position to the retracted position after the mask has been placed on the mask supporter.

5. The alignment method according to claim 1, wherein the temporary receiver can be at two positions, which are a receiving position in which the temporary receiver can receive the substrate or the mask, and a retracted position in which the temporary receiver can avoid interference with the substrate or the mask; and the temporary receiver is moved from the receiving position to the retracted position after the substrate has been suctioned to the substrate suctioner.

6. The alignment method according to claim 2, wherein when the horizontal coarse movement stage mechanism is driven to move the mask supporter in the horizontal plane, the position of the mask on the mask supporter is fixed by a mask fixing mechanism.

7. The alignment method according to claim 1, further comprising:
   detecting, using a position detector, positions of a substrate alignment mark formed on the substrate and a mask alignment mark formed on the mask, wherein
   the position of the substrate supported by the temporary receiver is adjusted on the basis of the substrate alignment mark detected by the position detector.

8. The alignment method according to claim 7, further comprising:
   moving the horizontal coarse movement stage mechanism, with the vertical coarse movement stage mechanism, to a position where the substrate alignment mark can be measured by the position detector.

9. The alignment method according to claim 3, wherein the position of the substrate supported by the temporary receiver, the position of the mask supported by the temporary receiver, and/or the position of the mask placed on the mask supporter are adjusted on the basis of the substrate alignment mark and the mask alignment mark, respectively, which are detected by a position detector configured to detect positions of a substrate alignment mark formed on the substrate and a mask alignment mark formed on the mask, and when the substrate alignment mark is not found in a detection field of view of the position detector step of adjusting when the position of the substrate is adjusted, the alignment method further includes:

driving the horizontal coarse movement stage mechanism to search for the substrate alignment mark; and calculating coordinates of the searched substrate alignment mark and repeating the adjusting the position of the substrate, the suctioning the substrate, and the readjusting the position of the mask on the basis of the calculated coordinates so that both the mask alignment mark and the substrate alignment mark enter the field of view of the position detector.

10. The alignment method according to claim 7, further comprising:
    finely adjusting a relative position between the substrate that has been positionally adjusted and the mask by a fine movement stage mechanism configured to adjust the position of the substrate suctioner.

11. The alignment method according to claim 10, wherein the fine movement stage mechanism is a magnetic levitation stage mechanism including a fixed plate section that is fixedly installed parallel to a suction surface of the substrate suctioner, a movable plate section that is relatively movable with respect to the fixed plate section, and a magnetic levitation unit configured to cause the movable plate section to magnetically levitate and move with respect to the fixed plate section.

12. The alignment mechanism according to claim 11, wherein the substrate suctioner is provided at the movable plate section.

13. An alignment method for adjusting positions of a substrate and a mask, the alignment method comprising:
    supporting the mask by a temporary receiver configured to (i) temporarily support the substrate before the substrate is suctioned by a substrate suctioner configured to suction and hold the substrate and to (ii) temporarily support the mask before the mask is supported by a mask supporter configured to support the mask;
    adjusting a position of the mask, while the mask is being supported by the temporary receiver, by driving a horizontal coarse movement stage mechanism configured to move both of (i) the mask supporter, which is configured to support the mask after the mask has been supported by the temporary receiver, and (ii) the temporary receiver, which is configured to temporarily support the substrate before the substrate is suctioned by a substrate suctioner and to temporarily support the mask before the mask is supported by the mask supporter, in a horizontal plane; and
    placing the mask, which has been positionally adjusted by driving the horizontal coarse movement stage mechanism to move the mask supporter and the temporary receiver in the horizontal plane, on the mask supporter.

14. A film forming method for forming a film on a substrate with a film forming material through a mask, the film forming method comprising:
    adjusting positions of the substrate and the mask by the alignment method according to claim 1, and
    forming a film on the substrate with the film forming material atomized by a film forming source through the mask.

* * * * *